(12) United States Patent
Fulford et al.

(10) Patent No.: US 12,439,641 B2
(45) Date of Patent: Oct. 7, 2025

(54) COMPACT 3D DESIGN AND CONNECTIONS WITH OPTIMUM 3D TRANSISTOR STACKING

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 652 days.

(21) Appl. No.: 17/714,716

(22) Filed: Apr. 6, 2022

(65) Prior Publication Data
US 2023/0163185 A1   May 25, 2023

Related U.S. Application Data

(60) Provisional application No. 63/281,427, filed on Nov. 19, 2021.

(51) Int. Cl.
| | |
|---|---|
| *H10D 30/67* | (2025.01) |
| *H10D 62/10* | (2025.01) |
| *H10D 64/23* | (2025.01) |
| *H10D 84/03* | (2025.01) |
| *H10D 88/00* | (2025.01) |

(52) U.S. Cl.
CPC ..... *H10D 30/6735* (2025.01); *H10D 30/6757* (2025.01); *H10D 62/118* (2025.01); *H10D 64/258* (2025.01); *H10D 84/038* (2025.01); *H10D 88/00* (2025.01); *H10D 88/01* (2025.01)

(58) Field of Classification Search
CPC .......... H10D 30/6735; H10D 30/6757; H10D 64/258; H10D 62/118; H10D 88/00; H10D 88/01; H10D 84/038
See application file for complete search history.

(56) References Cited

U.S. PATENT DOCUMENTS

| | | | |
|---|---|---|---|
| 2013/0270552 A1* | 10/2013 | Yamazaki .......... | H10D 30/6755 257/43 |
| 2013/0285050 A1* | 10/2013 | Yamazaki .......... | H10D 30/6755 257/43 |
| 2018/0151561 A1* | 5/2018 | Cantoro ................ | H10D 64/01 |
| 2019/0172751 A1* | 6/2019 | Smith ................ | H10D 30/6757 |
| 2019/0221640 A1* | 7/2019 | Reznicek ........... | H10D 30/0323 |
| 2020/0365703 A1* | 11/2020 | Chung .................. | H10D 30/62 |
| 2021/0104522 A1* | 4/2021 | Gardner .............. | H10D 62/832 |
| 2021/0134677 A1* | 5/2021 | Pan .................. | H01L 21/76205 |

(Continued)

*Primary Examiner* — Jami Valentine Miller
(74) *Attorney, Agent, or Firm* — Oblon, McClelland, Maier &Neustadt, L.L.P.

(57) ABSTRACT

A semiconductor device includes a first transistor and a second transistor. The first transistor includes a first channel structure positioned over a substrate, first source/drain (S/D) regions positioned on ends of the first channel structure, and a first gate structure disposed all around the first channel structure. The second transistor includes a second channel structure positioned over the first channel structure, second S/D regions positioned on ends of the second channel structure, and a second gate structure disposed all around the second channel structure. The second channel structure has a smaller dimension than the first channel structure in a horizontal direction substantially parallel to a working surface of the substrate.

20 Claims, 15 Drawing Sheets

(56) References Cited

U.S. PATENT DOCUMENTS

| | | | |
|---|---|---|---|
| 2022/0208594 A1* | 6/2022 | Or-Bach | H10B 43/20 |
| 2022/0320347 A1* | 10/2022 | Murray | H10D 86/0221 |
| 2022/0367628 A1* | 11/2022 | Zhu | H10D 30/014 |
| 2023/0056372 A1* | 2/2023 | Gardner | H10D 30/6757 |
| 2023/0108707 A1* | 4/2023 | Gardner | H10D 84/83 257/401 |

* cited by examiner

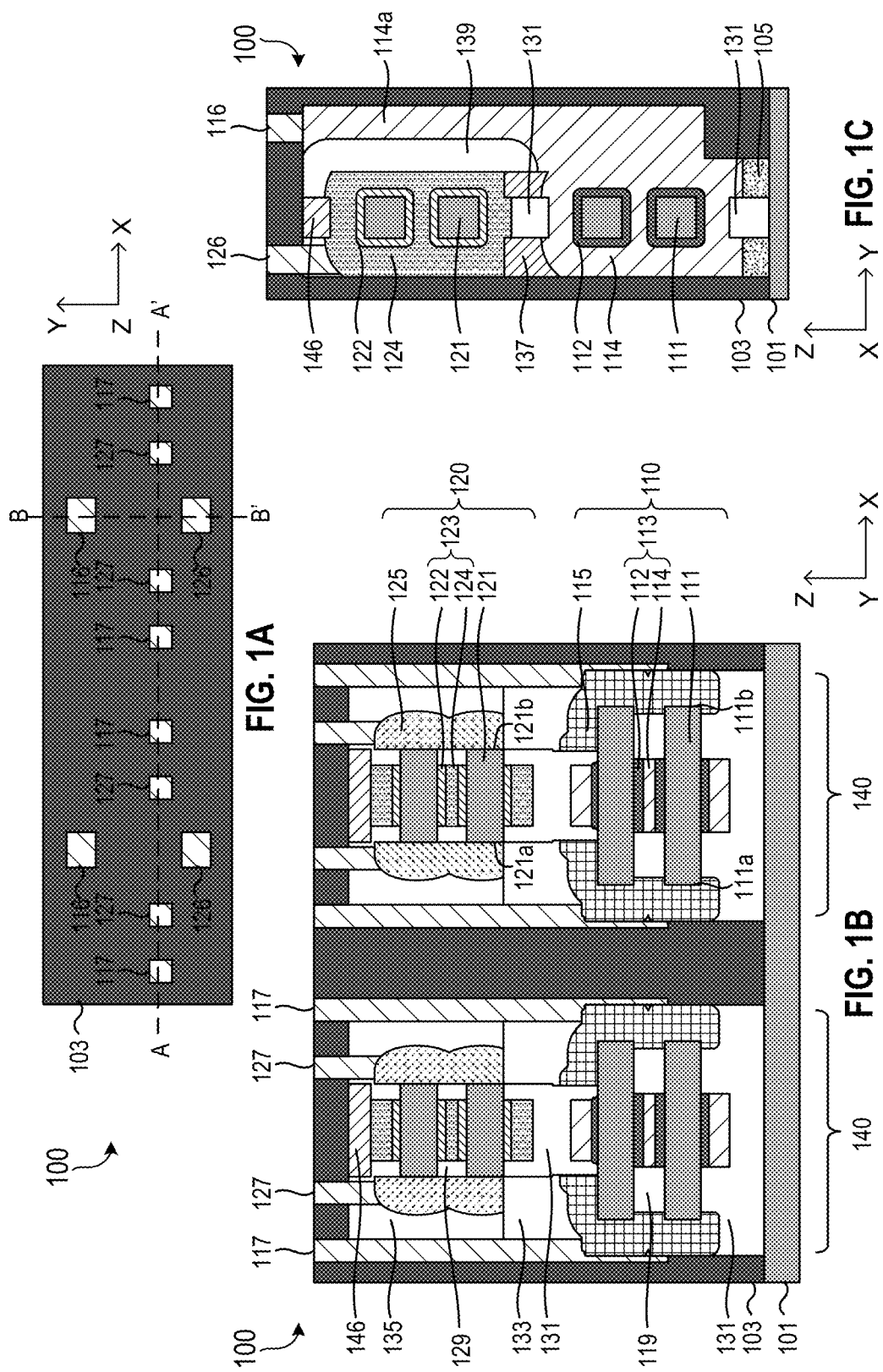

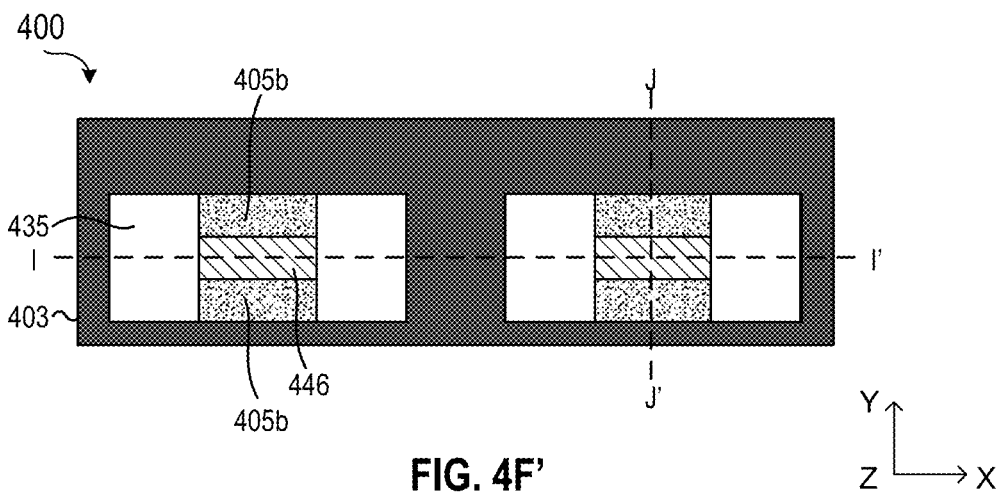
FIG. 4F'
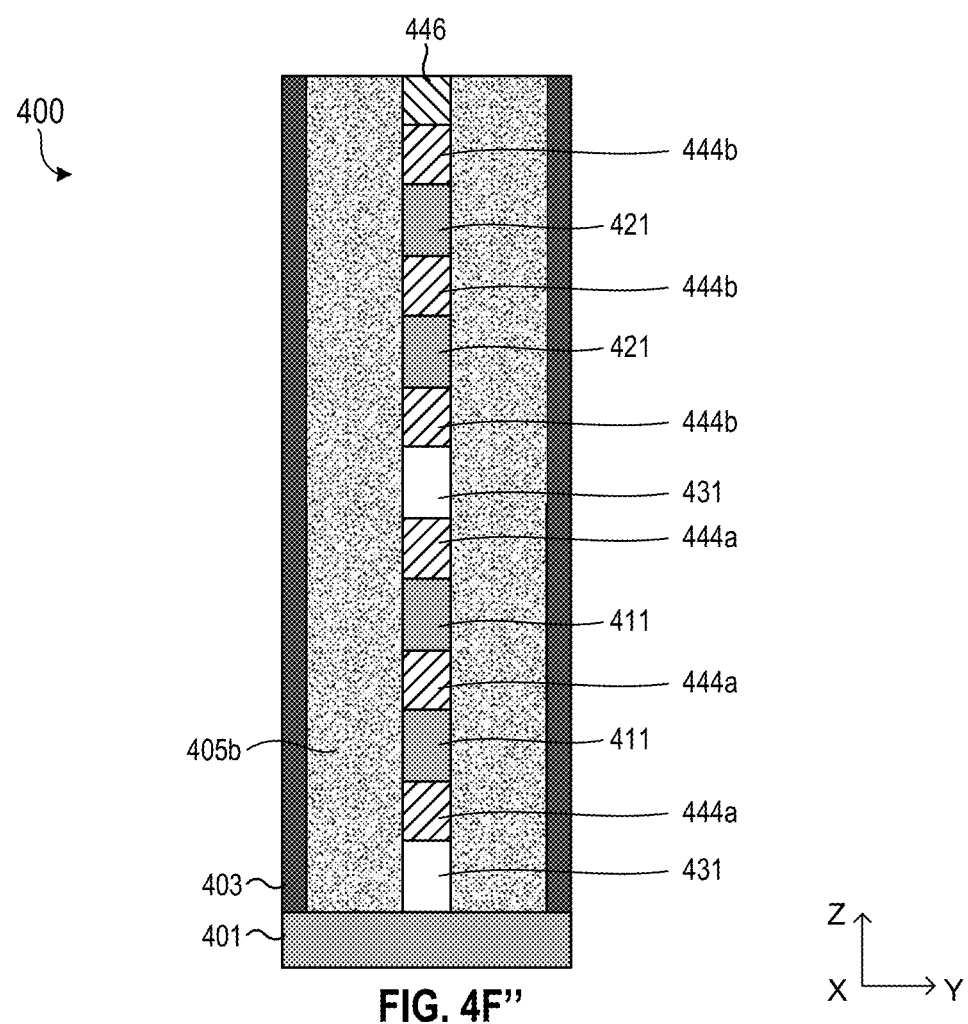
FIG. 4F"

COMPACT 3D DESIGN AND CONNECTIONS WITH OPTIMUM 3D TRANSISTOR STACKING

INCORPORATION BY REFERENCE

This present disclosure claims the benefit of U.S. Provisional Application No. 63/281,427, filed on Nov. 19, 2021, which is incorporated herein by reference in its entirety. Aspects of the present disclosure are related to Applicant's patent application titled "3D HIGH DENSITY SELF-ALIGNED NANOSHEET DEVICE FORMATION WITH EFFICIENT LAYOUT AND DESIGN", which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of microfabrication.

Aspect (1) includes a method of microfabrication. The method includes forming an initial stack of semiconductor layers by epitaxial growth over a substrate. The initial stack of semiconductor layers includes channel structures and sacrificial gate layers stacked alternatingly in a vertical direction substantially perpendicular to a working surface of the substrate. The channel structures include a first channel structure and a second channel structure positioned above the first channel structure. The initial stack of semiconductor layers is surrounded by a sidewall structure. First sides of the initial stack are trimmed by directionally etching the first sides of the initial stack to a pre-determined depth so that the second channel structure is etched to have a smaller dimension than the first channel structure in a horizontal direction substantially parallel to a working surface of the substrate. First portions of the sidewall structure are removed to uncover the first sides of the initial stack. Source/drain (S/D) regions are formed on uncovered side surfaces of the channel structures from the first sides of the initial stack. The S/D regions include first S/D regions on ends of the first channel structure and second S/D regions on ends of the second channel structure. The first S/D regions are offset from the second S/D regions in the horizontal direction. Second portions of the sidewall structure are removed to uncover second sides of the initial stack. The sacrificial gate layers are replaced with gate structures from the second sides of the initial stack.

Aspect (2) includes the method of Aspect (1), wherein the trimming the first sides of the initial stack includes forming one or more stair steps on each of the first sides of the initial stack.

Aspect (3) includes the method of Aspect (1), further including forming first vertical contact structures connected to the first S/D regions. The first vertical contact structures bypass the second channel structure. Second vertical contact structures are formed connected to the second S/D regions.

Aspect (4) includes the method of Aspect (1), wherein the forming the S/D regions includes forming a protective structure to cover respective side surfaces of the second channel structure from the first sides of the initial stack and forming the first S/D regions on respective side surfaces of the first channel structure.

Aspect (5) includes the method of Aspect (4), further including removing the protective structure and forming the second S/D regions on the respective side surfaces of the second channel structure.

Aspect (6) includes the method of Aspect (4), further including depositing a first filler material to cover the respective side surfaces of the first channel structure from the first sides of the initial stack. A second filler material is deposited over the first filler material to cover the respective side surfaces of the second channel structure. The second filler material is directionally etched to partially uncover the first filler material such that a remaining portion of the second filler material forms the protective structure. The first filler material is selectively etched to uncover the respective side surfaces of the first channel structure.

Aspect (7) includes the method of Aspect (1), wherein the sacrificial gate layers include one or more first sacrificial gate layers in direct contact with the first channel structure and one or more second sacrificial gate layers in direct contact with the second channel structure. The replacing the sacrificial gate layers with the gate structures includes forming a protective structure to cover respective side surfaces of the one or more second sacrificial gate layers from the second sides of the initial stack. The one or more first sacrificial gate layers are replaced with one or more first gate structures.

Aspect (8) includes the method of Aspect (7), further including removing the protective structure and replacing the one or more second sacrificial gate layers with one or more second gate structures.

Aspect (9) includes the method of Aspect (1), further including forming indentations by removing end portions of the sacrificial gate layers from the first sides of the initial stack. Inner spacers are formed in the indentations.

Aspect (10) includes the method of Aspect (1), wherein the replacing the sacrificial gate layers with the gate structures includes forming gate structures all around respective channel structures.

Aspect (11) includes the method of Aspect (1), wherein the replacing the sacrificial gate layers with the gate structures includes forming at least one gate dielectric of the gate structures selectively or non-selectively over uncovered portions of the channel structures. At least one work function metal (WFM) of the gate structures is formed over the at least one gate dielectric.

Aspect (12) includes the method of Aspect (1), wherein the forming the initial stack of semiconductor layers includes forming a first layer of a first dielectric material on a surface of a first semiconductor material over the substrate. An initial opening is formed within the first layer. The initial opening uncovers the first semiconductor material. The sidewall structure is formed within the initial opening such that the first semiconductor material is uncovered by an inner opening through the sidewall structure. The sidewall structure includes a second dielectric material. The initial stack of semiconductor layers is formed within the inner opening.

Aspect (13) includes a semiconductor device. The semiconductor device includes a first transistor and a second transistor. The first transistor includes a first channel structure positioned over a substrate, first source/drain (S/D) regions positioned on ends of the first channel structure, and a first gate structure disposed all around the first channel structure. The second transistor includes a second channel structure positioned over the first channel structure, second S/D regions positioned on ends of the second channel structure, and a second gate structure disposed all around the second channel structure. The second channel structure has a smaller dimension than the first channel structure in a horizontal direction substantially parallel to a working surface of the substrate.

Aspect (14) includes the semiconductor device of Aspect (13), wherein the ends of the first channel structure are offset in the horizontal direction from the ends of the second channel structure.

Aspect (15) includes the semiconductor device of Aspect (14), wherein the ends of the first channel structure each extend outwardly in the horizontal direction from a respective end of the second channel structure.

Aspect (16) includes the semiconductor device of Aspect (13), further including first vertical contact structures connected to the first S/D regions and second vertical contact structures connected to the second S/D regions. The first vertical contact structures bypass the second transistor.

Aspect (17) includes the semiconductor device of Aspect (13), wherein the first channel structure and the second channel structure include different chemical compositions.

Aspect (18) includes the semiconductor device of Aspect (13), wherein the first transistor includes a plurality of first channel structures stacked in a vertical direction substantially perpendicular to the working surface of the substrate. The first S/D regions are connected to the plurality of first channel structures. The first gate structure is disposed all around the plurality of first channel structures and separates the plurality of first channel structures from each other.

Aspect (19) includes the semiconductor device of Aspect (13), wherein the second transistor includes a plurality of second channel structures stacked in a vertical direction substantially perpendicular to the working surface of the substrate. The second S/D regions are connected to the plurality of second channel structures. The second gate structure is disposed all around the plurality of second channel structures and separates the plurality of second channel structures from each other.

Aspect (20) includes the semiconductor device of Aspect (13), further including first inner spacers positioned between the first gate structure and the first S/D regions and second inner spacers positioned between the second gate structure and the second S/D regions.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a top view of a semiconductor device, in accordance with one embodiment of the present disclosure.

FIG. 1B shows a vertical cross-sectional view taken along the line cut AA' in FIG. 1A, in accordance with one embodiment of the present disclosure.

FIG. 1C shows a vertical cross-sectional view taken along the line cut BB' in FIG. 1A, in accordance with one embodiment of the present disclosure.

FIG. 4A' shows a top view of the semiconductor device in FIG. 4A, in accordance with one embodiment of the present disclosure.

FIG. 4B' shows a top view of the semiconductor device in FIG. 4B, in accordance with one embodiment of the present disclosure.

FIG. 4C' shows a top view of the semiconductor device in FIG. 4C, in accordance with one embodiment of the present disclosure.

FIG. 4D' shows a top view of the semiconductor device in FIG. 4D, in accordance with one embodiment of the present disclosure.

FIG. 4F' shows a top view of the semiconductor device in FIG. 4F, in accordance with one embodiment of the present disclosure.

FIG. 4F'' shows a vertical cross-sectional view taken along the line cut HH' in FIG. 4F', in accordance with one embodiment of the present disclosure.

FIG. 4G' shows a top view of the semiconductor device in FIG. 4G, in accordance with one embodiment of the present disclosure.

DETAILED DESCRIPTION

Figures 2A, 2B, 2C:
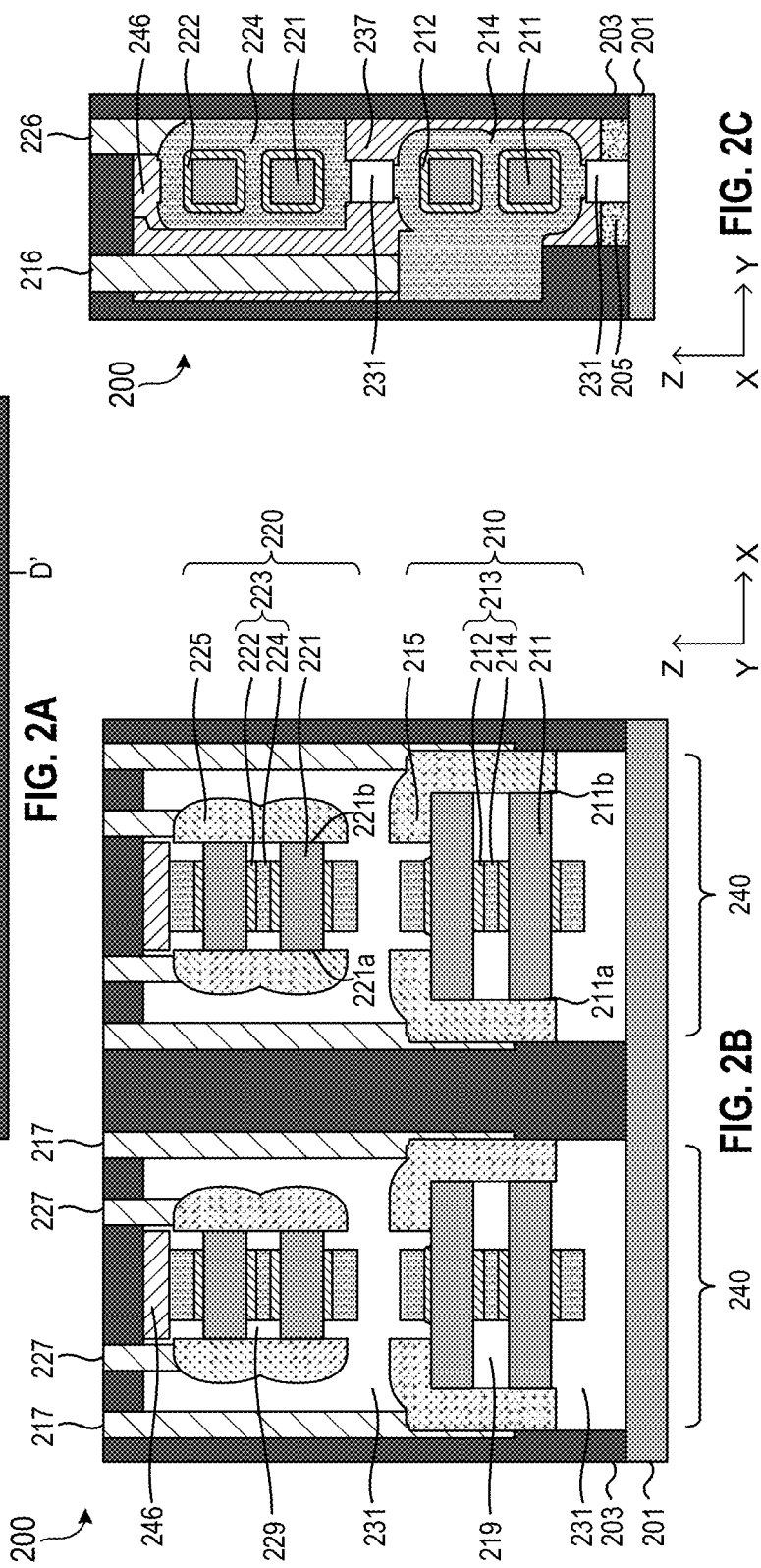
FIG. 2A shows a top view of a semiconductor device, in accordance with another embodiment of the present disclosure.
FIG. 2B shows a vertical cross-sectional view taken along the line cut CC' in FIG. 2A, in accordance with one embodiment of the present disclosure.
FIG. 2C shows a vertical cross-sectional view taken along the line cut DD' in FIG. 2A, in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein include stacked transistor designs and connections with optimum transistor stacking. Such techniques enable efficient 3D circuit design using horizontal nanosheets. One feature of techniques herein is that an S/D side of the horizontal 3D nanosheet transistor has differentially sized S/D epitaxially grown extensions, which enables simplified wiring from the top of the nanosheet once the device is completely fabricated. New features herein also enable connecting or hooking up the gate electrode from the top of the device using the GAA (gate-all-around) metal for multiple gate electrode connections from the top of the device. Techniques herein are compatible with many horizontal nanosheets architectures including, but not limited to, CFET (complementary field-effect transistor) and side-by-side NMOS (n-type metal-oxide-semiconductor) and PMOS (p-type metal-oxide-semiconductor). Any device stacking order can be used with techniques herein.

In one embodiment, isolation between future device regions is established first and then horizontal epitaxial stacks are grown. Illustrations herein include four silicon nanoplanes for illustrative purposes. One feature herein is that an S/D side of a horizontal 3D nanosheet transistor has differentially sized S/D epitaxially grown extensions which enables simplified wiring from the top of the nanosheets once the device is completely fabricated. Also shown is a flow for elements in the access of the gate electrode regions. These are shown perpendicular to the S/D sides of the horizontal nanosheet. Other invention options are shown below.

A first embodiment includes nanosheets with n-type Si and p-type Si together. A self-aligned scheme facilitates only one lithography step for each nanosheet device. Vertical hierarchy design allows separate connection for n-type Si and p-type Si. Another embodiment is one device type per 3D horizontal nanosheet stack, which can be either NMOS or PMOS in adjacent 3D stacks. As can be appreciated, all possible combinations with the different invention flow are alternative embodiments. Stacks herein can be N devices tall.

According to aspects of the present disclosure, transistors can be stacked in a vertical direction. The transistors include at least an upper transistor positioned over a lower transistor. An upper channel structure of the upper transistor is configured to be shorter than a lower channel structure of the lower transistor in a horizontal direction. As a result, upper S/D regions and lower S/D regions, which are disposed on respective ends of the upper transistor and the lower channel transistor, can be offset from each other in the horizontal direction. Vertical contact structures connected respectively to the upper S/D regions and the lower S/D regions can therefore also be offset from each other in the horizontal direction, which enables simplified wiring from a top perspective.

FIG. 1A shows a top view of a semiconductor device 100, in accordance with one embodiment of the present disclosure. FIGS. 1B and 1C respectively show vertical cross-sectional views taken along the line cuts AA' and BB' in FIG. 1A, in accordance with some embodiments of the present disclosure.

The semiconductor device 100 includes at least one (e.g. two) stack 140 of transistors (e.g. 110 and 120) stacked over a substrate 101 in a direction (e.g. the Z direction) substantially perpendicular to a working surface of the substrate 101. Each transistor can include at least one respective channel structure (e.g. 111 and 121), respective source/drain (S/D) regions (e.g. 115 and 125) positioned on respective ends of the at least one respective channel structure, and at least one respective gate structure (e.g. 113 and 123) disposed all around the at least one respective channel structure.

In a non-limiting example, the at least one stack 140 includes a first transistor 110 positioned over the substrate 101 and a second transistor 120 positioned over the first transistor 110. Specifically, the first transistor 110 can include one or more (e.g. two) first channel structures 111, first S/D regions 115 and at least one first gate structure 113 while the second transistor 120 can includes one or more (e.g. two) second channel structures 121, second S/D regions 125 and at least one second gate structure 123.

Since the first transistor 110 is similar to the second transistor 120, consider the first transistor 110 for example. In the examples of FIGS. 1A-1C, the first S/D regions 115 are in direct contact with the first channel structures 111 so that the first S/D regions 115 can be configured to function as common S/D regions. The first gate structure 113 can also be in direct contact with the first channel structures 111 and configured to function as a common gate structure. As a result, the first transistor 110 and the second transistor 120 each include a gate-all-around (GAA) multi-channel transistor. Of course it should be understood that the semiconductor device 100 can include any number of stacks 140 arranged in the XY plane over the substrate 101. Each of the stacks 140 can include any number of transistors arranged in the Z direction. Each transistor may include any number of channel structures arranged in the Z direction, while respective S/D regions and gate structures can be configured to electrically connect to any number of channel structures.

Note that the second channel structures 121 can have a smaller dimension (e.g. a length) than the first channel structures 111 in a horizontal direction (e.g. the X direction) substantially parallel to a working surface of the substrate 101. Ergo, the ends (e.g. 111*a* and 111*b*) of the first channel structures 111 are offset in the X direction from the ends (e.g. 121*a* and 121*b*) of the second channel structures 121. More specifically, the ends of the first channel structures 111 can each extend outwardly in the X direction from a respective end of the second channel structures 121. For example, an end 111*a* of the first channel structures 111 extends outwardly in the X direction from an end 121*a* of the second channel structures 121. An end 111*b* of the first channel structures 111 extends outwardly in the X direction from an end 121*b* of the second channel structures 121.

Further, the first S/D regions 115 can also be offset from the second S/D regions 125 in the X direction. As a result, first vertical contact structures 117, which are connected to the first S/D regions 115, can be offset in the X direction from second vertical contact structures 127, which are connected to the second S/D regions 125. Note that the first vertical contact structures 117 bypass the second transistor 120. That is, the difference in lengths between the first channel structures 111 and the second channel structures 121 can result in S/D regions that are offset from each other and/or have different sizes, which enables simplified wiring from a top perspective and compact 3D design for transistor stacking.

In some embodiments (not shown) where the stack 140 includes a plurality of transistors stacked in the Z direction, the channel structures arranged in the Z direction may have various lengths, e.g. ascending lengths from top to bottom in the Z direction. More specifically, an upper channel structure can have a smaller length than a lower channel structure that is positioned below the upper channel structure. As a result, vertical contact structures, which are connected to respective S/D regions, can be offset from each other. In other words, vertical contact structures connected to respective S/D regions of a lower transistor can bypass an upper transistor.

In some embodiments, the channel structures can include different chemical compositions from one another. That is, the channel structures can include different semiconductor materials, different dopants and/or different dopant concentration profiles. For instance, the first channel structures 111 may include a different chemical composition from the second channel structures 121. In one example, the first channel structures 111 include n-type silicon while the second channel structures 121 include p-type silicon. In another example, the first channel structures 111 include p-type silicon while the second channel structures 121 include n-type silicon. Additionally, the channel structures can have various shapes or geometry. For example, the channel structures can be nanosheets.

In some embodiments, the gate structures (e.g. 113 and 123) each include at least one work function metal (WFM) (e.g. 114 and 124) and at least one gate dielectric (e.g. 112 and 122). As can be appreciated, the WFMs 114 and 124 which function as the gate conductors may be different from each other, and the gate dielectrics 112 and 122 may also be different from each other, depending on respective channel structures (i.e. 111 and 121), design requirements (e.g. gate threshold voltage), etc. In this example, the WFM 114 is disposed all around the first channel structures 111 while the WFM 124 is disposed all around the second channel structures 121. Therefore, the first gate structure 113 and the second gate structure 123 can both be configured to function as common gate structures for multiple channel structures. In other examples (not shown), the first gate structure 113 and/or the second gate structure 123 may be disposed all around a single channel structure.

In the example of FIG. 1B, the first S/D regions 115 and the second S/D regions 125 are configured to electrically connect to a plurality of (e.g. two) channel structures. In alternative embodiments, the first S/D regions 115 and/or the second S/D regions 125 may be in direct contact with only one respective channel structure. Accordingly, the semiconductor device 100 can include one or more single-channel transistors.

As illustrated in FIG. 1C, the semiconductor device 100 can further include a third vertical contact structure 116 which is connected to the first gate structure 113, or rather the WFM 114. The semiconductor device 100 can also include a fourth vertical contact structure 126 which is connected to the second gate structure 123, or rather the WFM 124. A dielectric material 137 can separate the first gate structure 113 from the second gate structure 123, or rather separate the WFM 114 from the WFM 124, in the Z direction. Another dielectric material 139 can separate an extension portion 114*a* of the WFM 114 from the WFM 124 in the Y direction. Note that in this example, the extension portion 114*a* of the WFM 114 bypasses the WFM 124.

Further, inner spacers (e.g. 119 and 129) can be disposed on ends of the gate structures (e.g. 113 and 123). The inner spacers (e.g. 119) are insulating and therefore can separate the gate structures (e.g. 113) from respective S/D regions (e.g. 115). Particularly in this example, the WFM 114 is separated from a respective first S/D region 115 by a respective inner spacer 119 alone in the X direction. In other words, the WFM 114 is in direct contact with the inner spacers 119 in the X direction (without the gate dielectric 112 disposed in between). In another example (not shown), the WFM 114 is separated from a respective first S/D region 115 by a respective inner spacer 119 and the gate dielectric 112 in the X direction. In other words, a portion of the gate dielectric 112 is disposed between the WFM 114 and the respective first S/D region 115 in the X direction.

Additionally, the substrate 101 can include a semiconductor material. In some embodiments, the substrate 101 is positioned over an insulator disposed on a substrate (not shown). That is, an epitaxial layer of the semiconductor material is grown on a substrate having a dielectric layer disposed thereon. Thus, the stack 140A can be disposed over an SOI (silicon-on-insulator), a GeOI (Germanium-on-insulator), an SGOI (SiGe-on-insulator) or the like. In some embodiments, the substrate 101 can include completed devices with isolated silicon on top. In some embodiments, the substrate 101 includes single crystal silicon at a top surface of the substrate 101. The single crystal silicon can function as a seed layer for epitaxially growing a semiconductor layer thereon.

In some embodiments, the semiconductor device 100 can include dielectric materials, e.g. as shown by 103, 105, 112, 122, 131, 133, 135, 137, 139, 146, 119 and 129. The dielectric materials may also be referred to as isolation structures, isolation layers, diffusion breaks, inner spacers, gate dielectrics, etc. depending on functions thereof. For example, the dielectric material 133 can be used to separate the first S/D regions 115 from the second S/D regions 125 and thus be referred to as an isolation structure 133 or a diffusion break 133. Similarly, the dielectric material 137 can separate the first gate structure 113 from the second gate structure 123 and thus be referred to as an isolation structure 137. Additionally, some of the dielectric materials may include identical materials or may include different materials. For example, the dielectric material 131 and the inner spacers 119 and 129 may include a same material.

FIG. 2A shows a top view of a semiconductor device 200, in accordance with another embodiment of the present disclosure. FIGS. 2B and 2C respectively show vertical cross-sectional views taken along the line cuts CC' and DD' in FIG. 2A, in accordance with some embodiments of the present disclosure. Since the embodiment of the semiconductor device 200 is similar to the embodiment of the semiconductor device 100, descriptions herein will be provided with emphasis places on difference.

Note that similar or identical components are labeled with similar numerals unless specified otherwise. Specifically, first transistors 210 can correspond to the first transistor 110. Second transistors 220 can correspond to the second transistor 120. Channel structures (e.g. 211 and 221) can correspond to the channel structures (e.g. 111 and 121). Ends (e.g. 211a, 211b, 221a and 221b) of the channel structures (e.g. 211 and 221) can correspond to the ends (e.g. 111a, 111b, 121a and 121b) of the channel structures (e.g. 111 and 121). Gate structures (e.g. 213 and 223) can correspond to the gate structures (e.g. 113 and 123). WFMs (e.g. 214 and 224) can correspond to the WFMs (e.g. 114 and 124). Gate dielectrics (e.g. 212 and 222) can correspond to the gate dielectrics (e.g. 112 and 122). S/D regions (e.g. 215 and 225) can correspond to the S/D regions (e.g. 115 and 125). Vertical contact structures (e.g. 217, 227, 216 and 226) can correspond to the vertical contact structures (e.g. 117, 127, 116 and 126). Inner spacers (e.g. 219 and 229) can correspond to the inner spacers (e.g. 119 and 129). A substrate 201 can correspond to the substrate 101. A dielectric material 203 can correspond to the dielectric material 103.

Herein, within a given stack 240, first channel structures 211 and second channel structures 221 may include a same chemical composition as each other. Accordingly, first S/D regions 215 and second S/D regions 225 may include a same chemical composition as each other. First gate structures 213 and second gate structures 223 may also include a same chemical composition as each other. As a result, the first transistor 110 and the second transistor 120 may each be an n-type transistor or may each be a p-type transistor.

Note that a third vertical contact structure 216 bypasses a second gate structure 223 (or at least one WFM 224) and is connected to a first gate structure 213 (or at least one WFM 214). The third vertical contact structure 216 can correspond to the third vertical contact structure 116. That is, in an alternative embodiment (not shown) of FIG. 2C, the WFM 214 can include an extension portion which corresponds to the extension portion 114a and bypasses the WFM 224, similar to FIG. 1C. In an alternative embodiment (not shown) of FIG. 1C, the third vertical contact structure 116, rather than the extension portion 114a of the WFM 114, bypasses the WFM 124, similar to FIG. 2C.

In addition, the semiconductor device 200 can include dielectric materials, e.g. as shown by 203, 205, 212, 222, 231, 237, 246, 219 and 229. The dielectric materials may also be referred to as isolation structures, isolation layers, diffusion breaks, inner spacers, gate dielectrics, etc. depending on functions thereof. Some of the dielectric materials may include identical materials or may include different materials. For example, the dielectric material 231 and the inner spacers 219 and 229 may include a same material.

Figure 3:
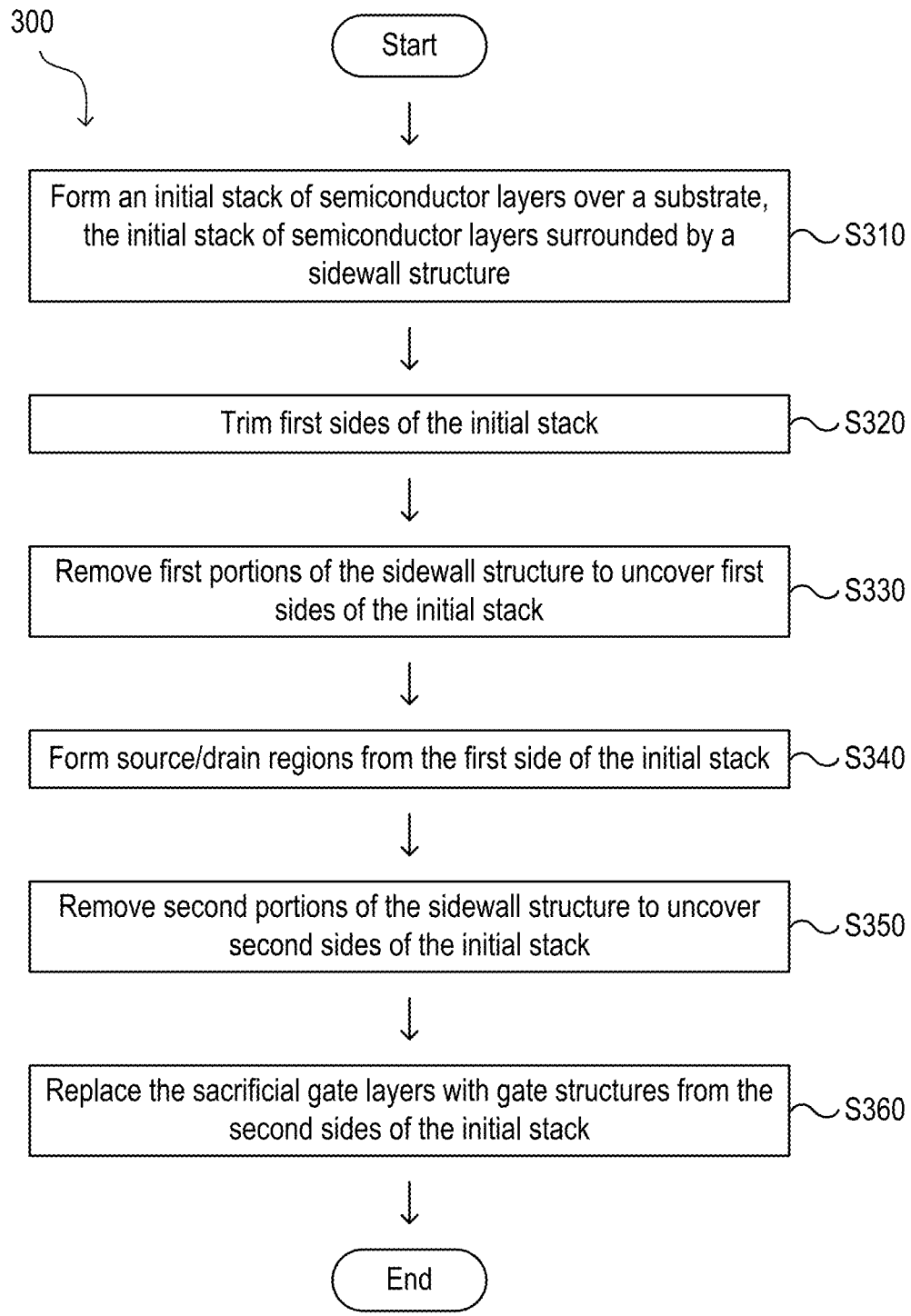
FIG. 3 shows a flow chart of a process for manufacturing a semiconductor device, in accordance with exemplary embodiments of the present disclosure.

FIG. 3 shows a flow chart of a process 300 for manufacturing a semiconductor device such as the semiconductor device 100, the semiconductor device 200 or the like, in accordance with exemplary embodiments of the present disclosure.

The process 300 starts with Step S310 where an initial stack of semiconductor layers is formed by epitaxial growth over a substrate. The initial stack of semiconductor layers includes channel structures and sacrificial gate layers stacked alternatingly in a vertical direction substantially perpendicular to a working surface of the substrate. The channel structures include at least one first channel structure and at least one second channel structure positioned above the first channel structure. The initial stack of semiconductor layers is surrounded by a sidewall structure.

In some embodiments, in order to form the initial stack of semiconductor layers, a first layer of a first dielectric material is formed on a surface of a first semiconductor material over the substrate. Then, an initial opening is formed within the first layer. The initial opening uncovers the first semiconductor material. Next, the sidewall structure is formed within the initial opening such that the first semiconductor material is uncovered by an inner opening through the sidewall structure. The sidewall structure includes a second dielectric material. Subsequently, the initial stack of semiconductor layers is formed within the inner opening.

The process 300 then proceeds to Step S320 by trimming first sides of the initial stack, for example by directionally etching the first sides of the initial stack to a pre-determined depth so that the second channel structure is etched to have a smaller dimension than the first channel structure in a horizontal direction substantially parallel to a working surface of the substrate. In some embodiments, trimming the first sides of the initial stack includes forming one or more stair steps on each of the first sides of the initial stack.

At Step S330, first portions of the sidewall structure are removed to uncover the first sides of the initial stack.

At Step S340, source/drain (S/D) regions are formed on uncovered side surfaces of the channel structures from the first sides of the initial stack. Particularly, the S/D regions include first S/D regions on ends of the first channel structure and second S/D regions on ends of the second channel structure. The first S/D regions are offset from the second S/D regions in the horizontal direction.

In some embodiments, in order to form the S/D regions, a protective structure is formed to cover respective side surfaces of the second channel structure from the first sides of the initial stack. The first S/D regions can then be formed on respective side surfaces of the first channel structure. Then, the protective structure is removed before the second S/D regions are formed on the respective side surfaces of the second channel structure.

At Step S350, second portions of the sidewall structure are removed to uncover second sides of the initial stack.

At Step S360, the sacrificial gate layers are replaced with gate structures from the second sides of the initial stack. In some embodiments, the sacrificial gate layers include one or more first sacrificial gate layers in direct contact with the first channel structure and one or more second sacrificial gate layers in direct contact with the second channel structure. Accordingly, a protective structure can be formed to cover respective side surfaces of the one or more second sacrificial gate layers from the second sides of the initial stack. The one or more first sacrificial gate layers are replaced with one or more first gate structures. The protective structure is removed. The one or more second sacrificial gate layers are replaced with one or more second gate structures.

In some embodiments, first vertical contact structures that are connected to the first S/D regions are formed. The first vertical contact structures can bypass the second channel structure. Second vertical contact structures that are connected to the second S/D regions are also formed.

FIGS. 4A, 4B, 4C, 4D, 4E, 4F, 4G, 4H, 4I, 4J and 4K show vertical cross-sectional views of a semiconductor device 400 at various intermediate steps of manufacturing, in accordance with some embodiments of the present disclosure. In some embodiments, FIGS. 4A, 4B, 4C, 4D and 4F respectively show vertical cross-sectional views (e.g. in the XZ plane) taken along the line cuts EE', FF', GG', HH' and II' in FIGS. 4A', 4B', 4C', 4D' and 4F', while FIGS. 4F'' and 4G respectively show vertical cross-sectional views (e.g. in the YZ plane) taken along the line cuts Jr and KK' in FIGS. 4F' and 4G'. In some embodiments, the semiconductor device 400 can eventually become the semiconductor device 100 or the like.

Figure 4A:
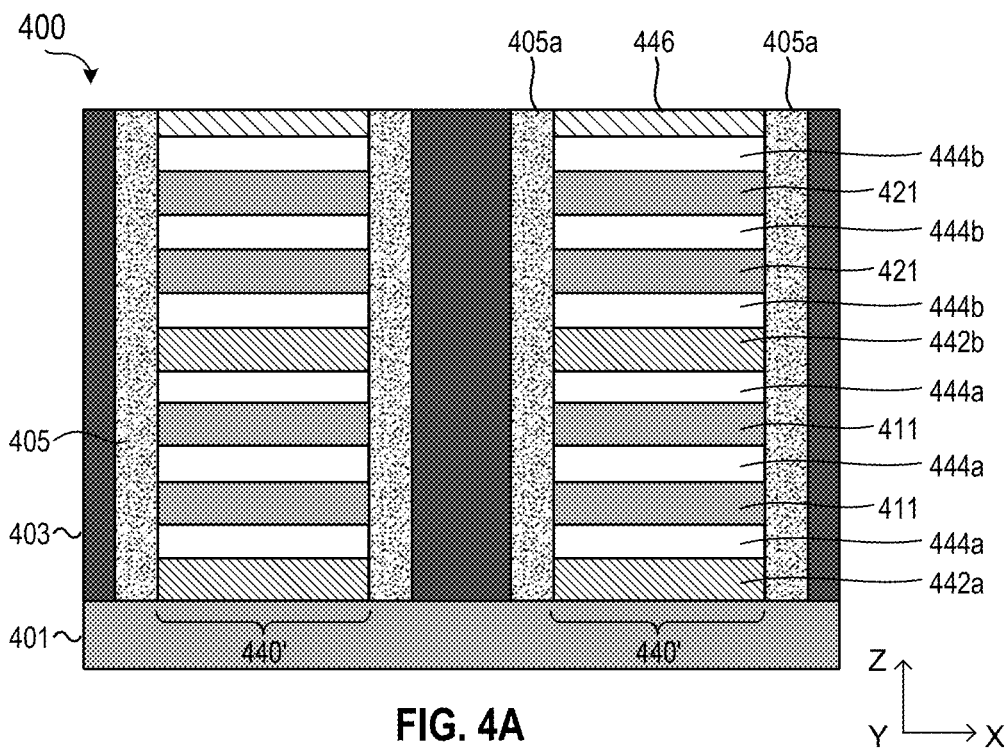
FIGS. 4A, 4B, 4C, 4D, 4E, 4F, 4G, 4H, 4I, 4J and 4K show vertical cross-sectional views of a semiconductor device at various intermediate steps of manufacturing, in accordance with some embodiments of the present disclosure.
Figure 4A:
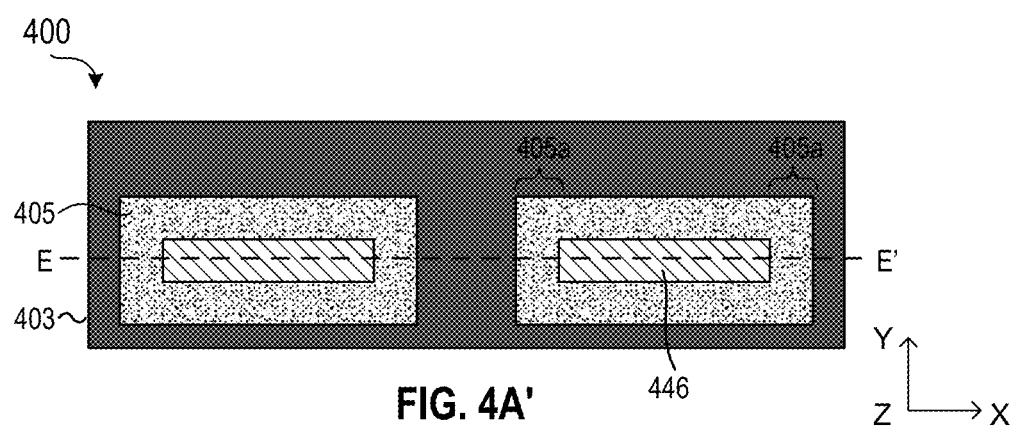

As shown in FIGS. 4A and 4A', the semiconductor device 400 includes a substrate 401 and at least one (e.g. two) initial stack 440' of semiconductor layers (e.g. as shown by 411, 421, 442a, 442b, 444a and 444b) formed thereon. The initial stack 440' of semiconductor layers is surrounded by a sidewall structure 405, which can be further surrounded by a first dielectric material 403. The sidewall structure 405 can, for example, include a second dielectric material.

Specifically, the at least one initial stack 440' of semiconductor layers can include channel structures (e.g. as shown by 411 and 421) and sacrificial gate layers 444 (e.g. as shown by 444a and 444b) stacked alternatingly in a vertical direction (e.g. the Z direction) substantially perpendicular to a working surface of the substrate 401. In a non-limiting example, the channel structures can include one or more (e.g. two) first channel structures 411 and one or more (e.g. two) second channel structures 421. Accordingly, the sacrificial gate layers 444 can include first sacrificial gate layers 444a, which are in direct contact with the first channel structures 411, and second sacrificial gate layers 444b which are in direct contact with the second channel structures 421. The initial stack 440' of semiconductor layers can further include sacrificial isolation layers 442 (e.g. as shown by 442a and 442b).

Note that the channel structures, the sacrificial gate layers 444 and the sacrificial isolation layers 442 can be configured to be etch selective to each other. In a non-limiting example, the channel structures include silicon (e.g. n-type Si and p-type Si). The sacrificial gate layers 444 include silicon germanium (noted as SiGe1) while the sacrificial isolation layers 442 include silicon germanium (noted as SiGe2). SiGe1 and SiGe2 can have different ratios of Si to Ge so as to have etch selectivity. For instance, SiGe1 can include 75 mol % of Si and 25 mol % of Ge, while SiGe2 can include 10 mol % of Si and 90 mol % of Ge.

In some embodiments, the first channel structures 411 can correspond to the first channel structures 111. The second channel structures 421 can be used to form second channel structures, which correspond to the second channel structures 121. The first sacrificial gate layers 444a can be used to form first gate structures, which correspond to the first gate structures 113, as well as form inner spacers, which correspond to the inner spacers 119. The second sacrificial gate layers 444b can be used to form second gate structures, which correspond to the second gate structures 123, as well as form inner spacers, which correspond to the inner spacers 129. The sacrificial isolation layers 442 can be replaced with dielectric materials, which correspond to the dielectric materials 131, 133 and/or 137, to form isolation, for example between transistors (e.g. 442b) or between a transistor and the substrate 401 (e.g. 442a). Additionally, the substrate 401 can correspond to the substrate 101. The first dielectric material 403 can correspond to the dielectric material 103.

As a result, the initial stack 440' can eventually become the stack 140 or the like. Accordingly, it should be understood that any number of the initial stacks 440' can be formed over the substrate 401. Each initial stack 440' of semiconductor layers can include any number of first channel structures 411 and second channel structures 421. Each initial stack 440' of semiconductor layers can include any number of sacrificial isolation layers 442 (for forming future isolation between transistors).

In some embodiments, in order to form the semiconductor device 400 shown in FIGS. 4A and 4A', firstly, a first layer of the first dielectric material 403 can be formed on the substrate 401 which includes a surface of a first semiconductor material. Secondly, an initial opening (not shown) can be formed within the first layer (for example by patterning with a trench rectangular mask), and the initial opening uncovers the first semiconductor material, or rather the substrate 401. Thirdly, the sidewall structure 405 of the second dielectric material is formed within the initial opening such that the first semiconductor material is uncovered by an inner opening (not shown) through the sidewall structure 405. For example, the second dielectric material can be deposited by ALD to fill the opening before directionally etched (for example similar to a spacer open etch) to form the inner opening within the second dielectric material while a remaining portion of the second dielectric material forms the sidewall structure 405. Fourthly, the initial stack 440' of semiconductor layers can be formed within the inner opening, for example by epitaxial growth over the surface of the first semiconductor material. Further, a capping layer 446 may optionally be formed over the initial stack 440'.

"Epitaxial growth", "epitaxial deposition", "epitaxially grown", "epitaxially formed" or "epitaxy" as used herein generally refers to a type of crystal growth or material deposition in which a crystalline layer is formed over a seed layer that is crystalline. Crystalline characteristics (e.g. crystal orientation) of the crystalline layer are related to or dictated by crystalline characteristics of the seed layer. Particularly, a semiconductor material can be epitaxially grown on a surface of another semiconductor layer that is crystalline. In some embodiments, epitaxial growth can be selective such that a semiconductor material may only be epitaxially grown on another semiconductor surface and generally do not deposit on exposed surfaces of non-semiconductor materials, such as silicon oxide, silicon nitride, and the like. Epitaxial growth can be accomplished by molecular beam epitaxy, vapor-phase epitaxy, liquid-phase epitaxy, or the like. Si, SiGe, Ge and other semiconductor materials can be doped during epitaxial growth (in situ) by addition of dopants. For example in vapor-phase epitaxy, a dopant vapor can be added to the gas source.

Figure 4B:
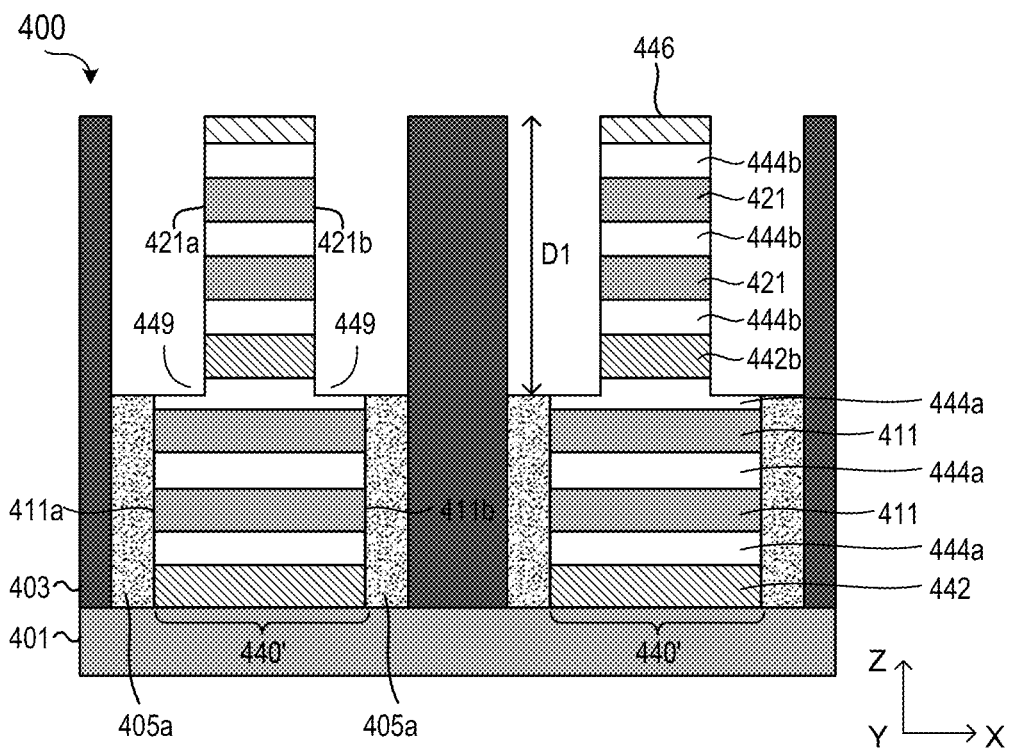
Figure 4B:
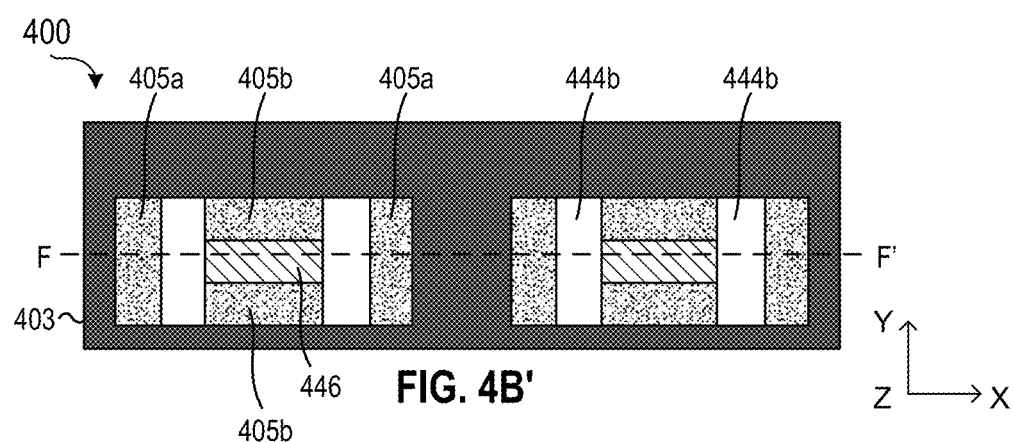

In FIGS. 4B and 4B', one or more first sides (e.g. the −X and +X sides) of the initial stack 440' are trimmed by directionally etching the first sides of the initial stack 440' to a pre-determined depth D1 so that the second channel structures 421 are etched to have a smaller dimension (e.g. a length) than the first channel structures 411 in a horizontal direction (e.g. the X direction) substantially parallel to a working surface of the substrate 401. Consequently, the second channel structures 421 can now correspond to the second channel structures 121. Ends (e.g. 421a and 421b) of the second channel structures 421 can correspond to the ends (e.g. 121a and 121b) of the second channel structures 121. Ends (e.g. 411a and 411b) of the first channel structures 411 can correspond to the ends (e.g. 111a and 111b) of the first channel structures 111.

Note that a stair step 449 can be formed on each of the first sides of the initial stack 440. While not shown, it should be understood that more stair steps can be formed on each of the first sides of the initial stack 440 by more trimming steps. That is, channel structures arranged in the Z direction can be trimmed (or directionally etched) multiple times on the first sides of the initial stack 440' to have various lengths, e.g. ascending lengths from top to bottom in the Z direction.

In this example, the capping layer 446 (e.g. a dielectric material), the second channel structures 421 (e.g. silicon), the second sacrificial gate layers 444b (SiGe1) and the sacrificial isolation layer 442b (e.g. SiGe2) are directionally etched with a stop layer at the first sacrificial gate layers 444a which may be partially etched. In another example (not shown), the capping layer 446 (e.g. a dielectric material), the second channel structures 421 (e.g. silicon) and the second sacrificial gate layers 444b (SiGe1) are directionally etched with a stop layer at the sacrificial isolation layer 442b (e.g. SiGe2) which may be partially etched.

In this example, first portions 405a of the sidewall structure 405 are etched back while second portions 405b of the sidewall structure 405 still cover one or more second sides (e.g. the −Y and +Y sides) of the initial stack 440'. In another example (not shown), the first sides of the initial stack 440' can be trimmed without etching back the first portions 405a of the sidewall structure 405.

Figure 4C:
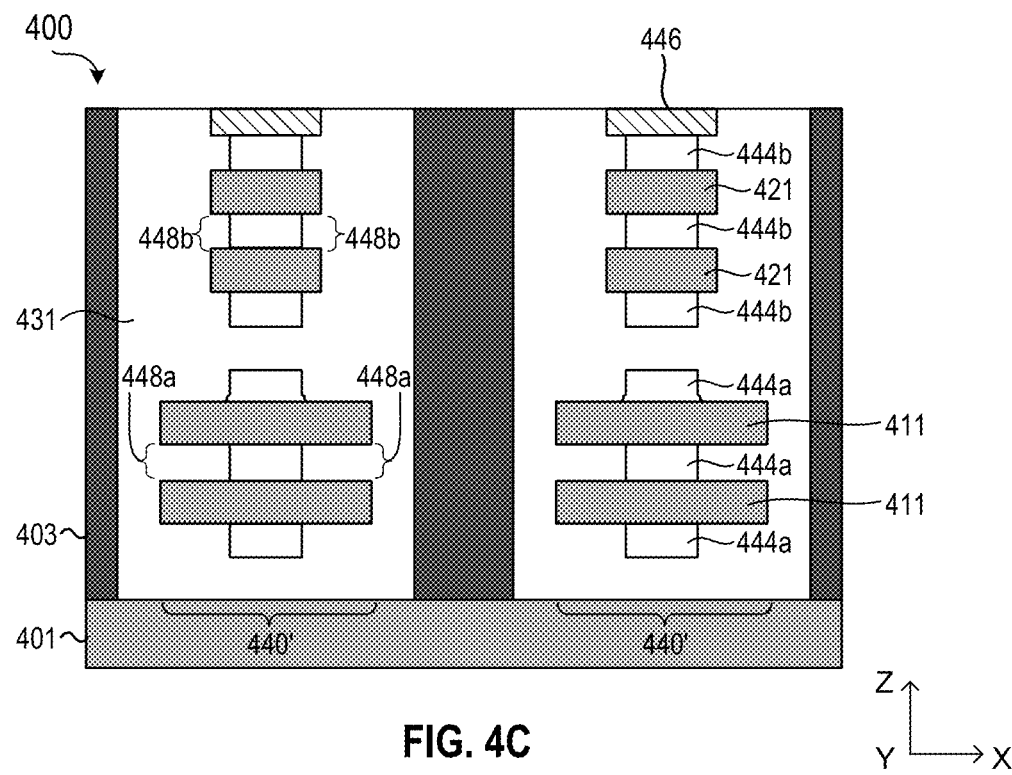
Figure 4C:
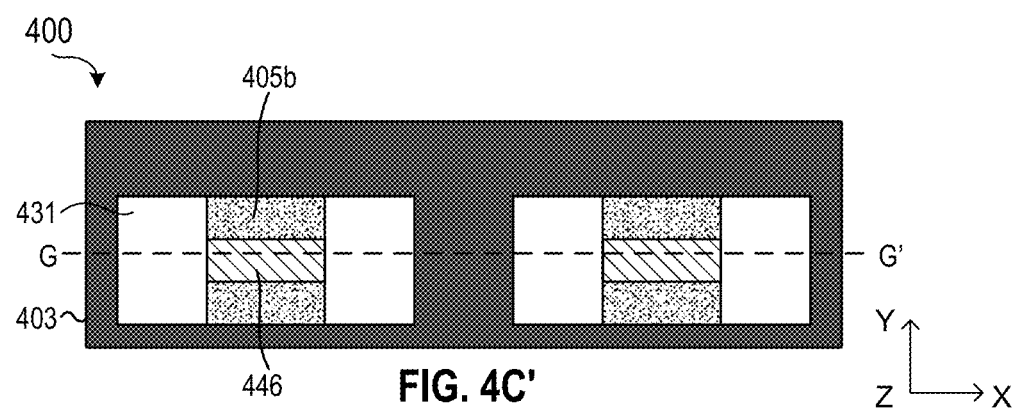

In FIGS. 4C and 4C', the first portions 405a of the sidewall structure 405 are removed to uncover the first sides of the initial stack 440'. Then, first indentations 448a and second indentations 448b are formed by removing end portions of (or recessing) the first sacrificial gate layers 444a and removing end portions of (or recessing) the second sacrificial gate layers 444b respectively from the first sides of the initial stack 440'. The sacrificial isolation layers 442 can also be removed from the first sides of the initial stack 440'. Subsequently, a first filler material 431 (or a third dielectric material 431) is deposited and optionally planarized, for example by chemical mechanical polishing (CMP), to cover the first sides of the initial stack 440'. Consequently, the first indentations 448a and the second indentations 448b are filled with the first filler material 431. In some embodiments, the third dielectric material 431 can eventually become the dielectric material 131.

In this example, the first sacrificial gate layers 444a and the second sacrificial gate layers 444b are shown to have substantially identical dimensions (e.g. lengths) in the X direction. For instance, during the wet etching of SiGe1 (e.g. the first sacrificial gate layers 444a), the bottom three SiGe1 layers (e.g. the first sacrificial gate layers 444a) can be exposed from three directions which can maintain the more or less similar SiGe1 layers in nanosheets irrespective of different lengths before being recessed. In another example (now shown), the first sacrificial gate layers 444a can have a larger length than the second sacrificial gate layers. For instance, the first indentations 448a and the second indentations 448b may have substantially identical dimensions (e.g. lengths) in the X direction as a result of a same etching process. Further, different etch rates of the sacrificial gate layers 444 and the sacrificial isolation layers 442 permits the same etch process step to form indentations 448 while completely removing the sacrificial isolation layers 442.

Figure 4D:
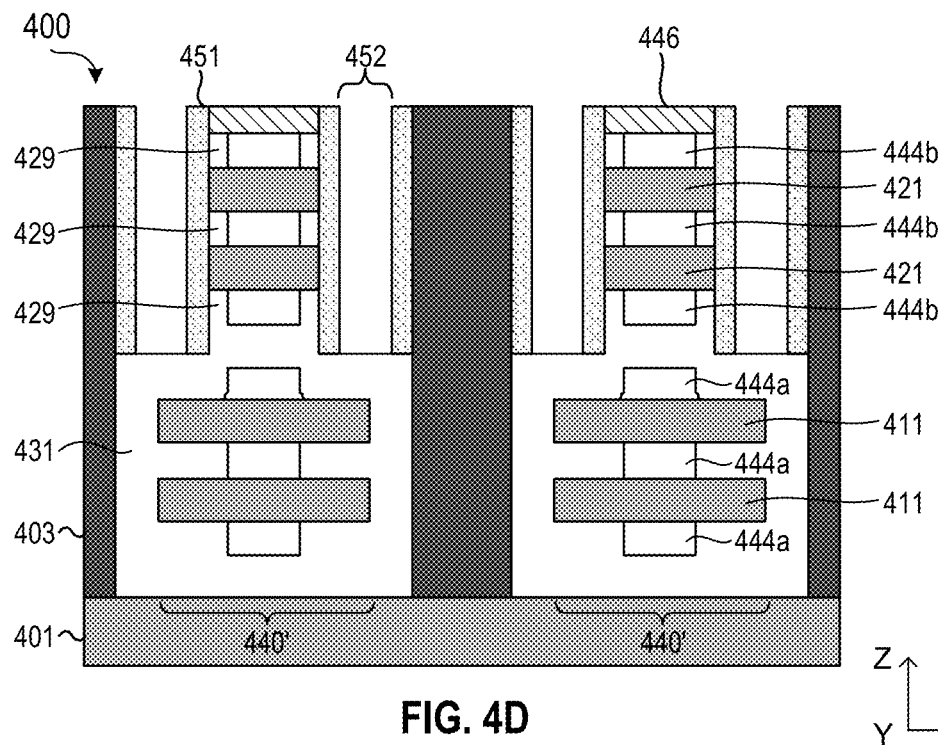
Figure 4D:
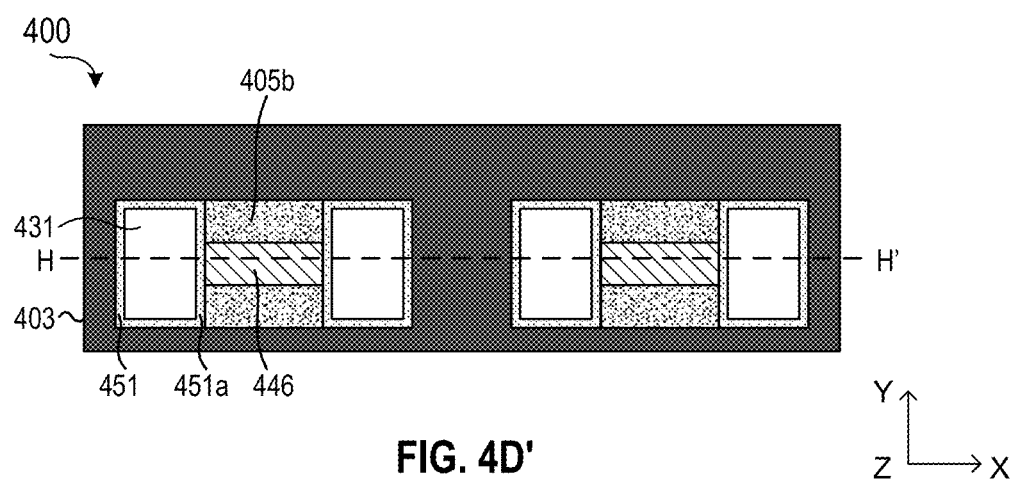

In FIGS. 4D and 4D', a first protective structure 451 is formed to cover side surfaces of the second channel structures 421 from the first sides of the initial stack 440'. Specifically, the first filler material 431 can be etched back to uncover the side surfaces of the second channel structures 421 while still leaving side surfaces of the first channel structures 411 covered. Subsequently, a second filler material (e.g. as partially shown by 451), which is etch selective to the first filler material 431, can be formed (for example by atomic layer deposition) over the first filler material 431 to cover the side surfaces of the second channel structures 421 (and optionally planarized). Next, the second filler material can be directionally etched to partially uncover the first filler material 431, for example by forming an opening 452, such that a remaining portion of the second filler material forms the first protective structure 451.

Note that inner spacers 429, which can correspond to the inner spacers 129, are formed as a result of etching back the first filler material 431. Further, the first protective structure 451 has a shape of a hollow rectangle in the top view in the FIG. 4D' example. It should be understood that the first protective structure 451 can have any suitable shape as long as the first protective structure 451 includes a portion 451a that covers the first sides of the initial stack 440'.

Figure 4E:
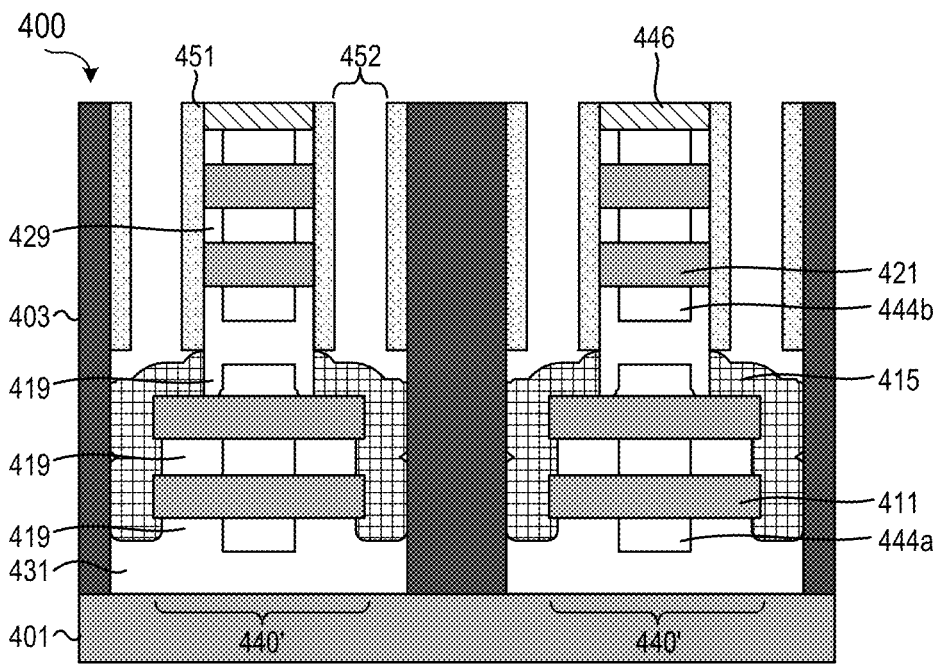

In FIG. 4E, the first filler material 431 is further etched back by selectively etching through the opening 452, which may for example include a first directional etching process and a second isotropic etching process. Consequently, inner spacers 419, which can correspond to the inner spacers 119, are formed. Moreover, the side surfaces of the first channel structures 411 are uncovered so that first S/D regions 415 (e.g. p-type silicon) can be formed thereon, for example by epitaxial growth (e.g. selectively from the side surfaces of the first channel structures 411). The first S/D regions 415 can correspond to the first S/D regions 115. Note that a remaining portion of the first filler material 431 can function to maintain isolation of the first S/D regions 415 from the substrate 401.

Figure 4F:
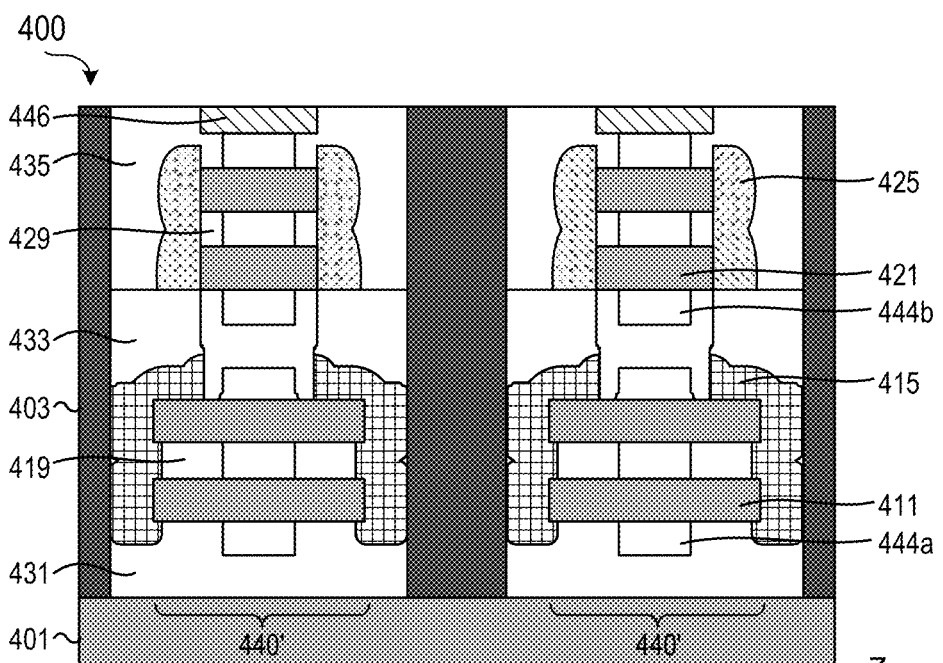

In FIGS. 4F, 4F' and 4F", the first protective structure 451 is removed to uncover the side surfaces of the second channel structures 421 from the first sides of the initial stack 440' so that second S/D regions 425 (e.g. n-type silicon) can be formed thereon, for example by epitaxial growth (e.g. selectively from the side surfaces of the second channel structures 421). Dielectric materials 433 and 435 can also be deposited (and optionally planarized). The second S/D regions 425 can correspond to the second S/D regions 125. The dielectric materials 433 and 435 can correspond to the dielectric materials 133 and 135 respectively. Thus, the first S/D regions 415 and the second S/D regions 425 can be offset from each other in the X direction. This vertical hierarchy can maintain enough gap horizontally to make individual connections side-by-side, e.g. for forming vertical contact structures (e.g. 117 and 127). Note that the vertical cross-sectional view (e.g. in the YZ plane) in FIG. 4F" is perpendicular to the vertical cross-sectional view (e.g. in the XZ plane) in FIG. 4F.

Figure 4G:
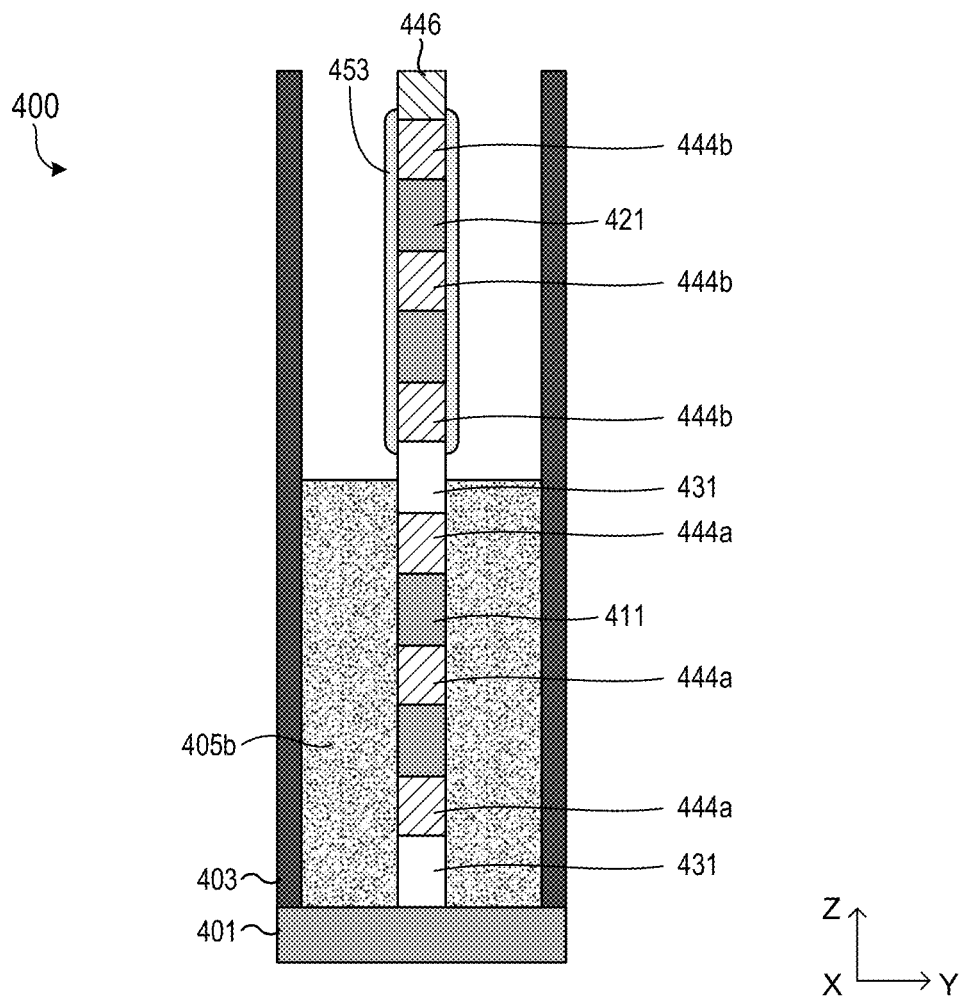
Figure 4G:
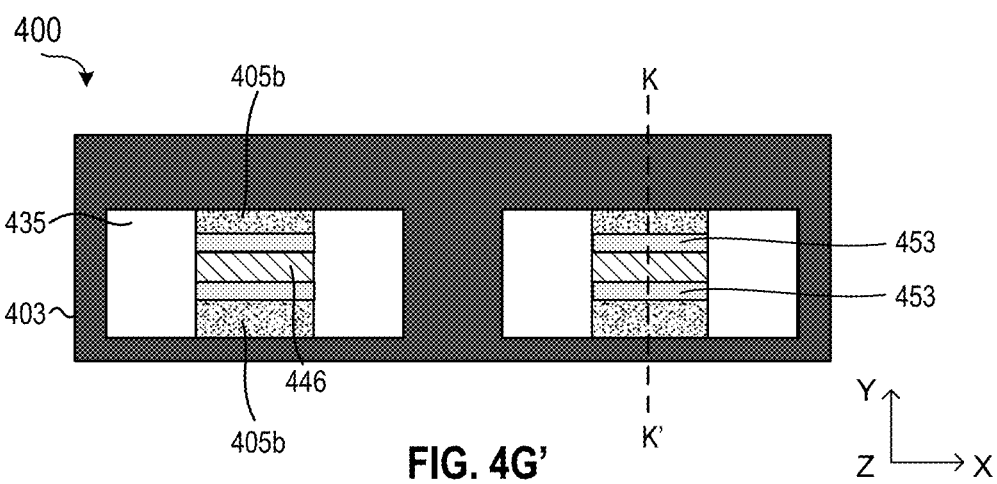

In FIGS. 4G and 4G', the second portions 405b of the sidewall structure 405 are etched back (for example to a separation point at the first filler material 431) to uncover side surfaces of the second channel structures 421 from the second sides (e.g. the −Y and +Y sides) of the initial stack 440'. A second protective structure 453 can then be formed to cover the side surfaces of the second channel structures 421 and the second sacrificial gate layers 444b, while leaving the second portions 405b of the sidewall structure 405 at least partially uncovered.

Figure 4H:
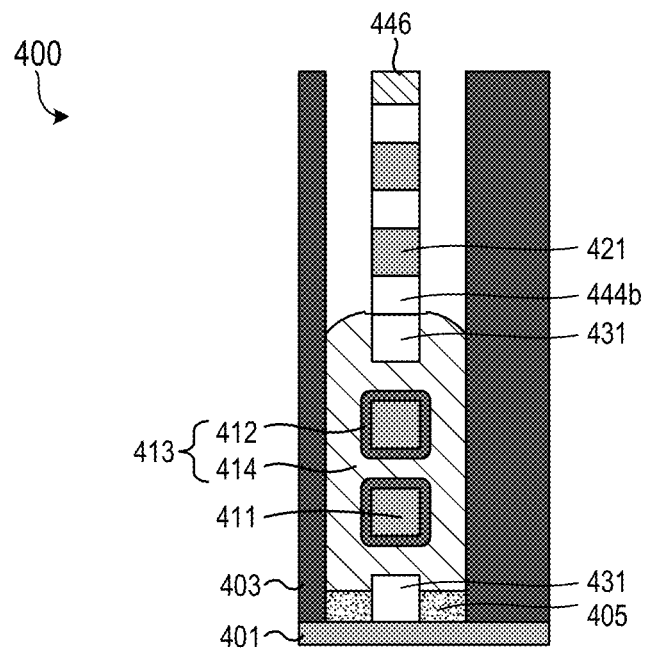

In FIG. 4H, a first gate structure 413, which includes at least one WFM 414 and at least one gate dielectric 412, is formed. Herein, the first gate structure 413 can correspond to the first gate structure 113. Accordingly, the at least one WFM 414 can correspond to the (at least one) WFM 114. The at least one gate dielectric 412 can correspond to the (at least one) gate dielectric 112.

Specifically, the second portions 405b of the sidewall structure 405 are further etched back to uncover side surfaces of the first sacrificial gate layers 444a from the second sides of the initial stack 440' so that the first sacrificial gate layers 444a can be replaced with the first gate structure 413. In one embodiment, the first sacrificial gate layers 444a are removed (for example by selective etching) after the second portions 405b of the sidewall structure 405 are further etched back. Next, at least one gate dielectric 412 can be selectively deposited on uncovered surfaces of the first channel structures 411. Subsequently, at least one WFM 414 is formed on the at least one gate dielectric 412 and etched back. Then, the second protective structure 453 is removed to uncover the second sacrificial gate layers 444b and the second channel structures 421 from the second sides of the initial stack 440'. In another embodiment, the second protective structure 453 may be removed after the first sacrificial gate layers 444a are removed and before forming the at least one gate dielectric 412. The at least one gate dielectric 412 and the at least one WFM 414 may therefore be deposited on the side surfaces of the second channel structures 421 and the second sacrificial gate layers 444b before etched back.

Figure 4I:
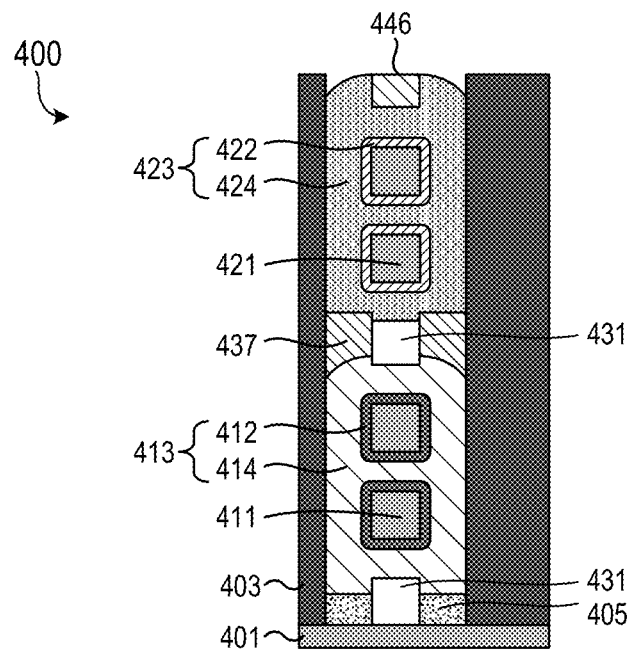

In FIG. 4I, a second gate structure 423 is formed, and a dielectric material 437 is formed between the first gate structure 413 and the second gate structure 423. Specifically, the dielectric material 437 can be formed over the first gate structure 413 and optionally planarized or etched back. Then, at least one gate dielectric 422 can be selective deposited on the uncovered side surfaces of the second channel structures 421 while at least one WFM 424 can be deposited and optionally planarized by CMP.

Herein, the second gate structure 423 can correspond to the second gate structure 123. The at least one WFM 424 can correspond to the (at least one) WFM 124. The at least one gate dielectric 422 can correspond to the (at least one) gate dielectric 122. The dielectric material 437 can correspond to the dielectric material 137.

Referring back to FIG. 4H, the gate dielectric 412 is selectively deposited on the uncovered surfaces of the first channel structures 411 by selective deposition. In an alternative embodiment (not shown), the gate dielectric 412 can be formed non-selectively on uncovered surfaces, e.g. the uncovered surfaces of the first channel structures 411, the second channel structures 421, the second sacrificial gate layers 444b, the first dielectric material 403, etc. As a result, a portion of the gate dielectric 412 may be disposed between the WFM 414 and the first S/D regions 415 in the X direction in a vertical cross-sectional view (not shown) in the XZ plane. The gate dielectric 412 can be formed by atomic layer deposition (ALD) for example. Similarly, in an alternative embodiment of FIG. 4I, the gate dielectric 422 can be non-selectively formed on uncovered surfaces for example by ALD.

Figure 4J:
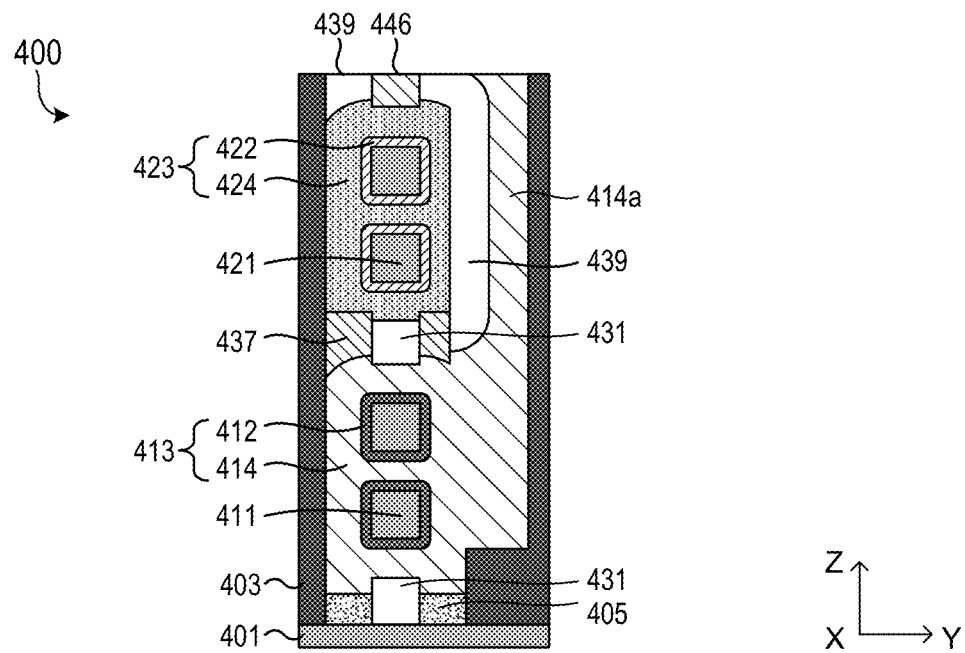

In FIG. 4J, the first dielectric material 403 is directionally and partially etched back before an extension portion 414a of the WFM 414 and a dielectric material 439 are formed. As illustrated, the extension portion 414a of the WFM 414 bypasses the second gate structure 423 while separated from the second gate structure 423 by the dielectric material 439. Herein, the extension portion 414a of the WFM 414 can correspond to the extension portion 114a of the WFM 114. The dielectric material 439 can correspond to the dielectric material 139, and a thickness of the dielectric material 439 can be adjusted for separation.

In one embodiment (not shown), the first dielectric material 403 is directionally and partially etched back to form a first trench. Then, the dielectric material 439 is selectively formed on uncovered surfaces of the WFM 424 before the extension portion 414a of the WFM 414 is formed to fill (the rest of) the first trench. In another embodiment (not shown), at least one metal material, which is the same as the WFM 414, is deposited to fill the first trench before directionally etched back to form a second trench. The (remaining) at least one metal material forms the extension portion 414a of the WFM 414 while the dielectric material 439 can be deposited to fill the second trench.

Figure 4K:
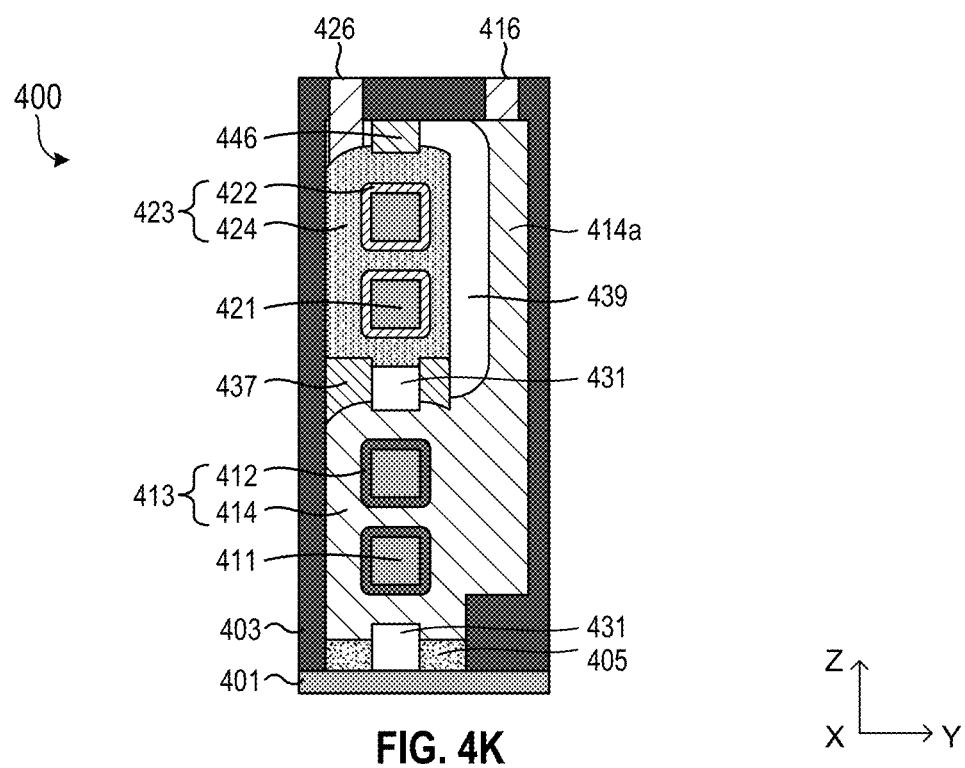

In FIG. 4K, vertical contact structures (e.g. 416 and 426) can be formed, for example by depositing and planarizing the first dielectric material 403 and patterning with an interconnection mask. A third vertical contact structure 416 can correspond to the third vertical contact structure 116. A fourth vertical contact structure 426 can correspond to the fourth vertical contact structure 126. While not shown, vertical contact structures that correspond to the first vertical contact structures 117 and/or the second vertical contact structures 127 can also be formed. Therefore, FIG. 4K can correspond to FIG. 1C. Moreover, the semiconductor device 400 can become the semiconductor device 100.

Referring back to FIG. 4J, the extension portion 414a of the WFM 414 and the dielectric material 439 are formed. In alternative embodiments of FIGS. 4J and 4K, the extension portion 414a of the WFM 414 need not bypass the second gate structure 423. The third vertical contact structure 416 can instead extend further in the Z direction and bypass the second gate structure 423 (similar to the third vertical contact structure 216).

FIGS. 5A, 5B, 5C, 5D and 5E show vertical cross-sectional views of a semiconductor device 500 at various intermediate steps of a manufacturing process, such as the process 300, in accordance with some embodiments of the present disclosure.

Figure 5A:
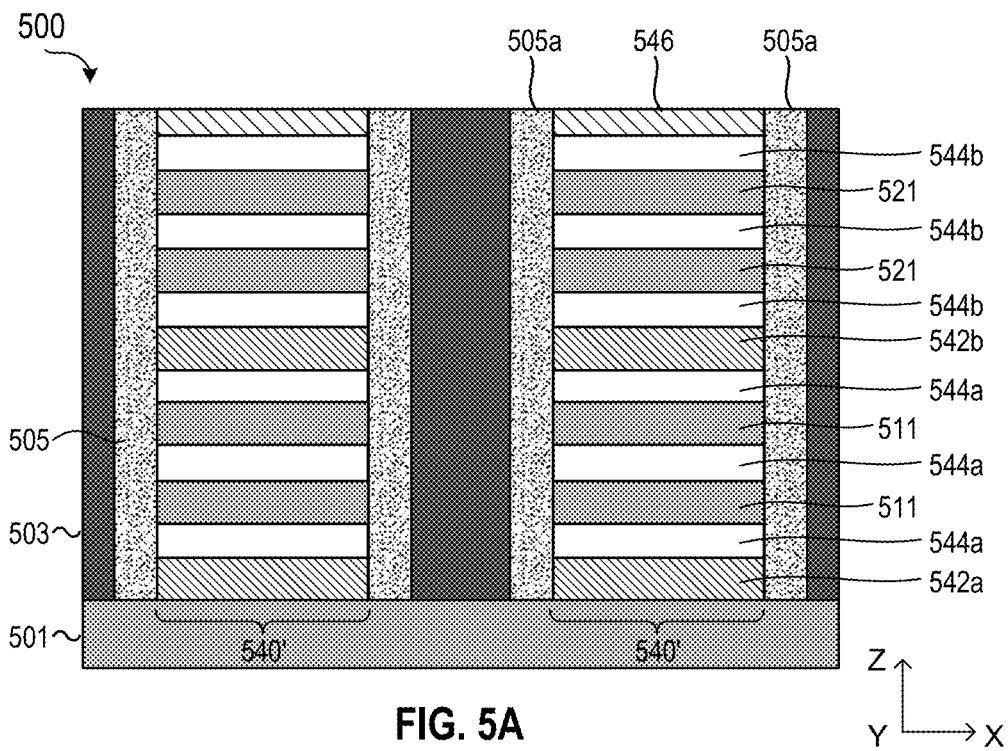
FIGS. 5A, 5B, 5C, 5D and 5E show vertical cross-sectional views of a semiconductor device at various intermediate steps of manufacturing, in accordance with some embodiments of the present disclosure.

Note that FIG. 5A can correspond to FIG. 4A: similar or identical components are labeled with similar numerals unless specified otherwise. Specifically, at least one (e.g. two) initial stack 540' of semiconductor layers can correspond to the at least one stack 440' of semiconductor layers. First channel structures 511 can correspond to the first channel structures 411. Second channel structures 521 can correspond to the second channel structures 421. First sacrificial gate layers 544a can correspond to the first sacrificial gate layers 444a. Second sacrificial gate layers 544b can correspond to the second sacrificial gate layers 444b. Sacrificial isolation layers (e.g. 542a and 542b) can correspond to the sacrificial isolation layers (e.g. 442a and 442b). A capping layer 546 can correspond to the capping layer 446. A sidewall structure 505 can correspond to the sidewall structure 405. First portions 505a of the sidewall structure 505 can correspond to the first portions 405a of the sidewall structure 405. A first dielectric material 503 can correspond to the first dielectric material 403. A substrate 501 can correspond to the substrate 401. The descriptions have been provided before and will be omitted herein for simplicity purposes.

In some embodiments, the semiconductor device 500 can eventually become the semiconductor device 200 or the like. Specifically, the initial stack 540' of semiconductor layers can eventually become the stack 240 (of transistors). The first channel structures 511 can correspond to the first channel structures 211. The second channel structures 521 can eventually become the second channel structures 221. The first sacrificial gate layers 544a can be used to form first gate structures, which correspond to the first gate structures 213, as well as form first inner spacers, which correspond to the inner spacers 219. The second sacrificial gate layers 544b can be used to form second gate structures, which correspond to the second gate structures 223, as well as form second inner spacers, which correspond to the inner spacers 229. The sacrificial isolation layers 542a and 542b can be replaced with dielectric materials, which correspond to the dielectric materials 231 and/or 237, to form isolation, for example between transistors (e.g. 542b) or between a transistor and the substrate 501 (e.g. 542a). Additionally, the substrate 501 can correspond to the substrate 201. The first dielectric material 503 can correspond to the dielectric material 203.

Figure 5B:
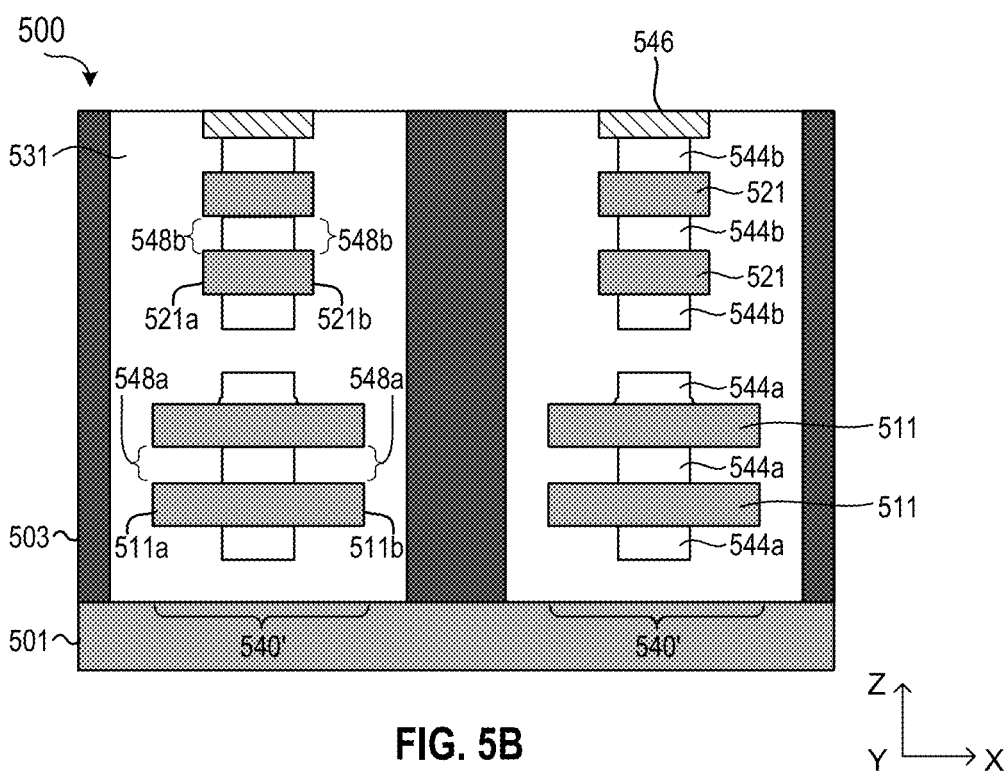

FIG. 5B can correspond to FIG. 4C and go through similar processes, including trimming first sides (e.g. the −X and +X sides) of the initial stack 540', removing the first portions 505a of the sidewall structure 505 to uncover the first sides of the initial stack 540', forming first indentations 548a and second indentations 548b, and depositing a filler material 531 (or a dielectric material 531). As a result, the second channel structures 521 are etched to have a smaller dimension (e.g. a length) than the first channel structures 511 in the X direction. Ends (e.g. 511a and 511b) of the first channel structures 511 are offset in the X direction from ends (e.g. 521a and 521b) of the second channel structures 521.

The second channel structures 521 can now correspond to the second channel structures 221. The ends (e.g. 511a and 511b) of the first channel structures 511 can correspond to the ends (e.g. 211a and 211b) of the first channel structures 211. The ends (e.g. 521a and 521b) of the second channel structures 521 can correspond to the ends (e.g. 221a and 221b) of the second channel structures 221. Additionally, the first indentations 548a can correspond to the first indentations 448a. The second indentations 548b can correspond to the second indentations 448b. The dielectric material 531 can correspond to the third dielectric material 431.

Figure 5C:
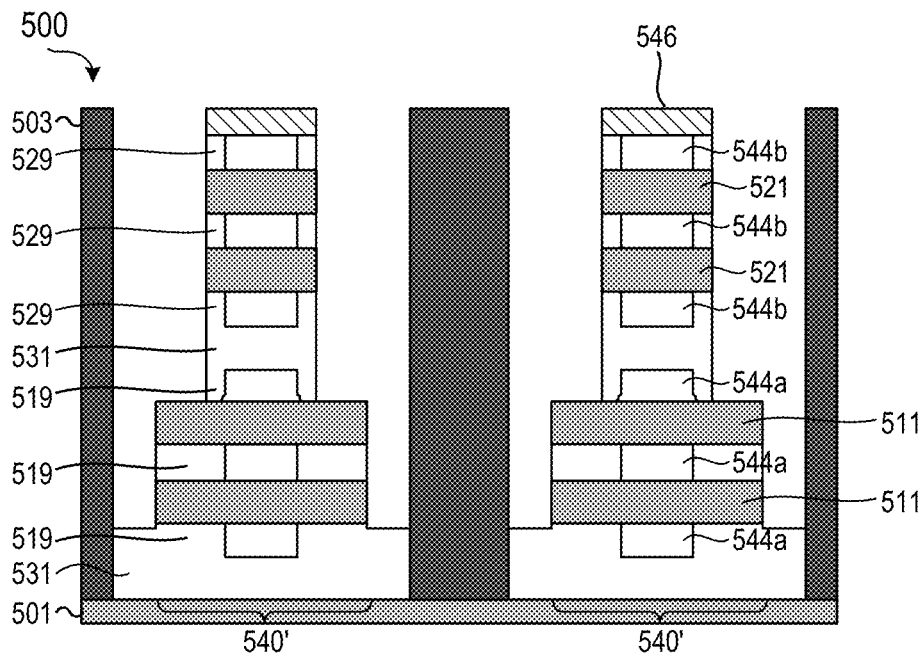

In FIG. 5C, the dielectric material 531 can be selectively and directionally etched back. As a result, the first sides of the initial stack 540' are uncovered. In addition, inner spacers 519 and 529 are formed. The inner spacers 519 and 529 can respectively correspond to the inner spacers 219 and 229.

Figure 5D:
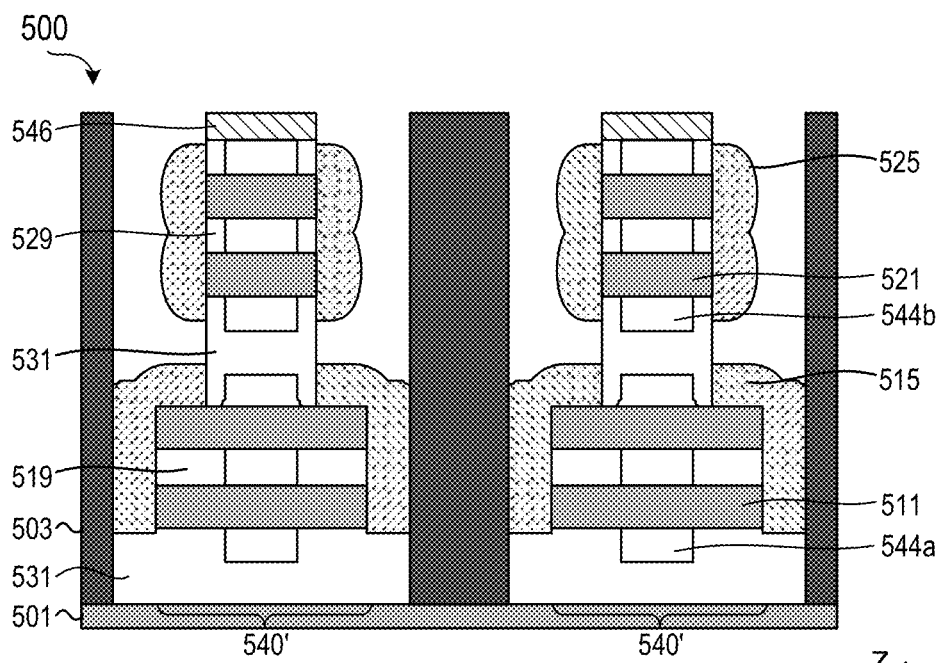

In FIG. 5D, first S/D regions 515 and second S/D regions 525 are formed, for example by epitaxial growth selectively from uncovered side surfaces of the first channel structures 511 and selectively from uncovered side surfaces of the second channel structures 521 respectively. The first S/D regions 515 and the second S/D regions 525 can be formed in a same epitaxial growth process. For example, the first S/D regions 515 and the second S/D regions 525 can both include p-type silicon (or both include n-type silicon) and thus be epitaxially grown on silicon surfaces (e.g. the first channel structures 511 and the second channel structures 521). The first S/D regions 515 can correspond to the first S/D regions 215. The second S/D regions 525 can correspond to the second S/D regions 225.

Figure 5E:
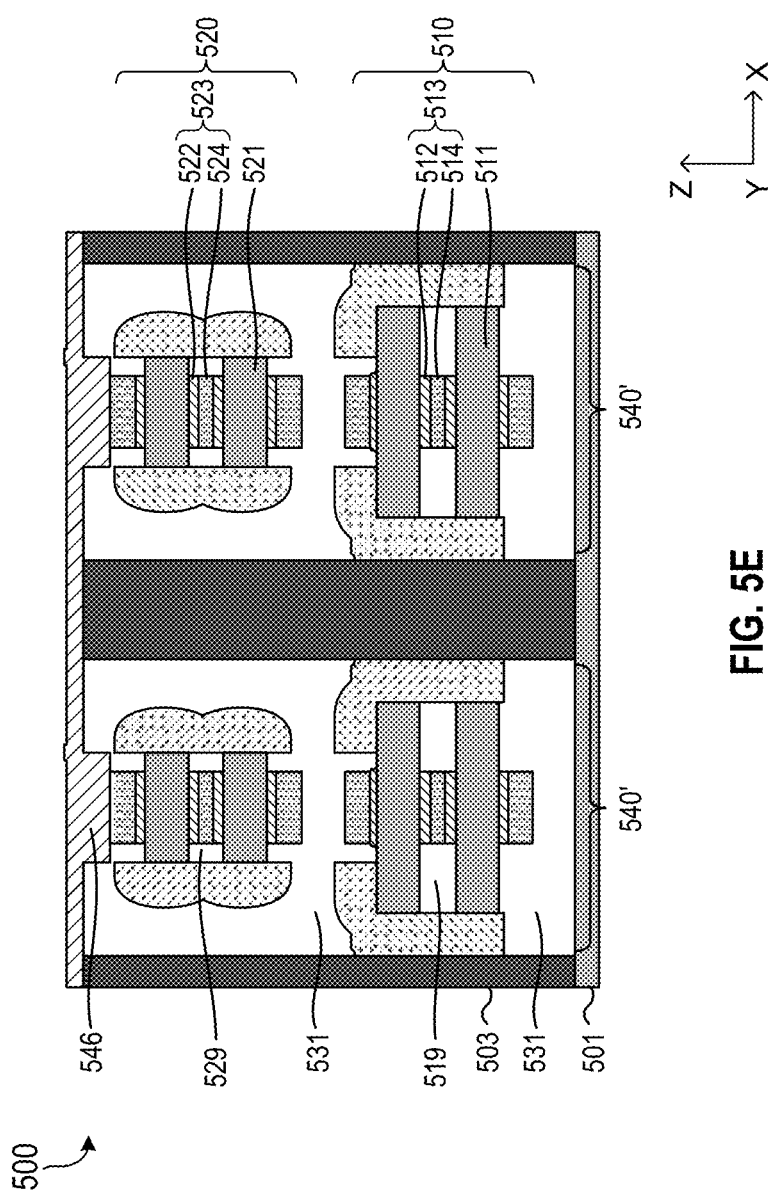

In FIG. 5E, a first gate structure 513 and a second gate structure 523 can be formed, for example by processes similar to what is shown in FIGS. 4G, 4G', 4H and 4I. The first gate structure 513 can correspond to the first gate structure 213. The second gate structure 523 can correspond to the second gate structure 223. Accordingly, gate dielectrics 512 and 522 can respectively correspond to the gate dielectrics 212 and 222. WFMs 514 and 524 can respectively correspond to the WFMs 214 and 224.

While not shown, vertical contact structures, which correspond to the vertical contact structures (e.g. 217, 227, 216 and 226), can be formed, for example by processes similar to what is shown in FIGS. 4J and 4K. Therefore, the semiconductor device 500 can become the semiconductor device 200.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a first transistor comprising a first channel structure positioned over a substrate, first source/drain (S/D) regions positioned on ends of the first channel structure, and a first gate structure disposed all around the first channel structure; and
   a second transistor comprising a second channel structure positioned over the first channel structure, second S/D regions positioned on ends of the second channel structure, and a second gate structure disposed all around the second channel structure,
   wherein the second channel structure has a smaller dimension than the first channel structure in a horizontal direction substantially parallel to a working surface of the substrate.

2. A semiconductor device, comprising:
   a first transistor comprising a first channel structure positioned over a substrate, first source/drain (S/D) regions positioned on ends of the first channel structure, and a first gate structure disposed all around the first channel structure; and
   a second transistor comprising a second channel structure positioned over the first channel structure, second S/D regions positioned on ends of the second channel structure, and a second gate structure disposed all around the second channel structure,
   wherein the second channel structure has a smaller dimension than the first channel structure in a horizontal direction substantially parallel to a working surface of the substrate, and the ends of the first channel structure are offset in the horizontal direction from the ends of the second channel structure.

3. The semiconductor device of claim 2, wherein:
   the ends of the first channel structure each extend outwardly in the horizontal direction from a respective end of the second channel structure.

4. A semiconductor device, comprising:
   a first transistor comprising a first channel structure positioned over a substrate, first source/drain (S/D) regions positioned on ends of the first channel structure, and a first gate structure disposed all around the first channel structure;
   a second transistor comprising a second channel structure positioned over the first channel structure, second S/D regions positioned on ends of the second channel structure, and a second gate structure disposed all around the second channel structure, wherein the second channel structure has a smaller dimension than the first channel structure in a horizontal direction substantially parallel to a working surface of the substrate;
   first vertical contact structures connected to the first S/D regions, wherein the first vertical contact structures bypass the second transistor; and
   second vertical contact structures connected to the second S/D regions.

5. The semiconductor device of claim 1, wherein:
   the first channel structure and the second channel structure comprise different chemical compositions.

6. The semiconductor device of claim 1, wherein:
   the first transistor comprises a plurality of first channel structures stacked in a vertical direction substantially perpendicular to the working surface of the substrate,
   the first S/D regions are connected to the plurality of first channel structures, and
   the first gate structure is disposed all around the plurality of first channel structures and separates the plurality of first channel structures from each other.

7. The semiconductor device of claim 1, wherein:
   the second transistor comprises a plurality of second channel structures stacked in a vertical direction substantially perpendicular to the working surface of the substrate,
   the second S/D regions are connected to the plurality of second channel structures, and
   the second gate structure is disposed all around the plurality of second channel structures and separates the plurality of second channel structures from each other.

8. The semiconductor device of claim 1, further comprising:
   first inner spacers positioned between the first gate structure and the first S/D regions; and
   second inner spacers positioned between the second gate structure and the second S/D regions.

9. The semiconductor device of claim 2, wherein:
   the first channel structure and the second channel structure comprise different chemical compositions.

10. The semiconductor device of claim 2, wherein:
    the first transistor comprises a plurality of first channel structures stacked in a vertical direction substantially perpendicular to the working surface of the substrate,
    the first S/D regions are connected to the plurality of first channel structures, and
    the first gate structure is disposed all around the plurality of first channel structures and separates the plurality of first channel structures from each other.

11. The semiconductor device of claim 2, wherein:
    the second transistor comprises a plurality of second channel structures stacked in a vertical direction substantially perpendicular to the working surface of the substrate,
    the second S/D regions are connected to the plurality of second channel structures, and
    the second gate structure is disposed all around the plurality of second channel structures and separates the plurality of second channel structures from each other.

12. The semiconductor device of claim 2, further comprising:
    first inner spacers positioned between the first gate structure and the first S/D regions; and
    second inner spacers positioned between the second gate structure and the second S/D regions.

13. The semiconductor device of claim 2, further comprising:
    first vertical contact structures connected to the first S/D regions, wherein the first vertical contact structures bypass the second transistor; and
    second vertical contact structures connected to the second S/D regions.

14. The semiconductor device of claim 3, further comprising:
    first vertical contact structures connected to the first S/D regions, wherein the first vertical contact structures bypass the second transistor; and
    second vertical contact structures connected to the second S/D regions.

15. The semiconductor device of claim 4, wherein:
    the first channel structure and the second channel structure comprise different chemical compositions.

16. The semiconductor device of claim 4, wherein:
the first transistor comprises a plurality of first channel structures stacked in a vertical direction substantially perpendicular to the working surface of the substrate,
the first S/D regions are connected to the plurality of first channel structures, and
the first gate structure is disposed all around the plurality of first channel structures and separates the plurality of first channel structures from each other.

17. The semiconductor device of claim 4, wherein:
the second transistor comprises a plurality of second channel structures stacked in a vertical direction substantially perpendicular to the working surface of the substrate,
the second S/D regions are connected to the plurality of second channel structures, and
the second gate structure is disposed all around the plurality of second channel structures and separates the plurality of second channel structures from each other.

18. The semiconductor device of claim 4, further comprising:
first inner spacers positioned between the first gate structure and the first S/D regions; and
second inner spacers positioned between the second gate structure and the second S/D regions.

19. The semiconductor device of claim 5, wherein:
the first transistor comprises a plurality of first channel structures stacked in a vertical direction substantially perpendicular to the working surface of the substrate,
the first S/D regions are connected to the plurality of first channel structures, and
the first gate structure is disposed all around the plurality of first channel structures and separates the plurality of first channel structures from each other.

20. The semiconductor device of claim 19, wherein:
the second transistor comprises a plurality of second channel structures stacked in a vertical direction substantially perpendicular to the working surface of the substrate,
the second S/D regions are connected to the plurality of second channel structures, and
the second gate structure is disposed all around the plurality of second channel structures and separates the plurality of second channel structures from each other.

\* \* \* \* \*